(12) United States Patent
Pereira et al.

(10) Patent No.: US 6,252,789 B1
(45) Date of Patent: Jun. 26, 2001

(54) INTER-ROW CONFIGURABILITY OF CONTENT ADDRESSABLE MEMORY

(75) Inventors: Jose Pio Pereira, Santa Clara; Varadarajan Srinivasan, Los Altos Hills, both of CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/594,203

(22) Filed: Jun. 14, 2000

(51) Int. Cl.$^7$ ................................................. G11C 15/00
(52) U.S. Cl. ........................................ 365/49; 365/189.07
(58) Field of Search ................................. 365/49, 189.07

(56) References Cited

U.S. PATENT DOCUMENTS

| | | | |
|---|---|---|---|
| 3,257,646 | 6/1966 | Roth | 340/172.5 |
| 3,353,159 | 11/1967 | Lee, III | 340/172.5 |
| 4,575,818 | 3/1986 | Almy et al. | 365/49 |
| 4,622,653 | 11/1986 | McElroy | 365/49 |
| 5,053,991 | 10/1991 | Burrows | 365/49 |
| 5,072,422 | 12/1991 | Rachels | 365/49 |
| 5,394,353 | * 2/1995 | Nusinov et al. | 365/49 |
| 5,440,715 | 8/1995 | Wyland | 395/435 |
| 5,483,480 | 1/1996 | Yoneda | 365/49 |
| 5,787,458 | 7/1998 | Miwa | 711/108 |
| 5,818,786 | 10/1998 | Yoneda | 365/230.03 |
| 5,930,790 | * 7/1999 | Law et al. | 365/49 |
| 5,943,252 | 8/1999 | Schultz et al. | 365/49 |
| 6,081,441 | * 6/2000 | Ikeda | 365/49 |
| 6,081,442 | 6/2000 | Igarashi et al. | 365/49 |
| 6,147,890 | 11/2000 | Kawana et al. . | |

OTHER PUBLICATIONS

Ken Schultz and Andrew Sorowka, "High Performance CAMs for 10GB/s and Beyond", Gigabit Ethernet Conference (GEC2000), Mar. 27, 2000, pp. 147–154.

* cited by examiner

Primary Examiner—Son T. Dinh
(74) Attorney, Agent, or Firm—Blakely, Sokoloff, Taylor & Zafman

(57) ABSTRACT

A CAM system for storing a data word chain having a sequence of one or more data words stored in one or more rows of CAM cells. For one embodiment, the CAM system includes rows of CAM cells each for storing a data word in a data word chain, match lines, and width expansion logic circuits each having a plurality of control inputs for receiving a plurality of control signals. The width expansion logic circuits are interconnected and determine when and how match results are communicated to a priority encoder and to each other. The control signals are for determining the operation of the width expansion logic circuits and for indicating when a first data word, a continuing data word, and a last data word of the data word chain are provided for comparison with the rows of CAM cells. The continuing data word is a data word between the first and last data word in the data word chain. For one embodiment, the control signals are generated by an instruction decoder in response to decoding separate instructions for comparing the first data word, a continuing data word, and the last data word of a data word chain. Each row of CAM cells may also include classification information or control bits that indicate the data word chain or the place of a data word in the data word chain. For one embodiment, the CAM system can store and operate on data word chains of different lengths.

49 Claims, 22 Drawing Sheets

| ST | END | Function |
|---|---|---|
| 0 | 0 | Continuing Word |
| 0 | 1 | Last Word |
| 1 | 0 | First Word |
| 1 | 1 | Default Word |

FIG. 2

| Instruction | Match Control Signals | | | | MCO | OML |
|---|---|---|---|---|---|---|
| | DFLT | FRST | CNT | LST | | |
| Compare Last Word | 0 | 0 | 0 | 1 | 0 | IML•MCI |
| Compare Continuing Word | 0 | 0 | 1 | 0 | IML•MCI | 0 |
| Compare First Word | 0 | 1 | 0 | 0 | IML | 0 |
| Default Compare | 1 | 0 | 0 | 0 | 0 | IML |

FIG. 3

| Function | ST | END | MCO | OML |
|---|---|---|---|---|
| Continuing Word | 0 | 0 | IML•MCI | 0 |
| Last Word | 0 | 1 | 0 | IML•MCI |
| First Word | 1 | 0 | IML | 0 |
| Default Word | 1 | 1 | 0 | IML |
FIG. 9
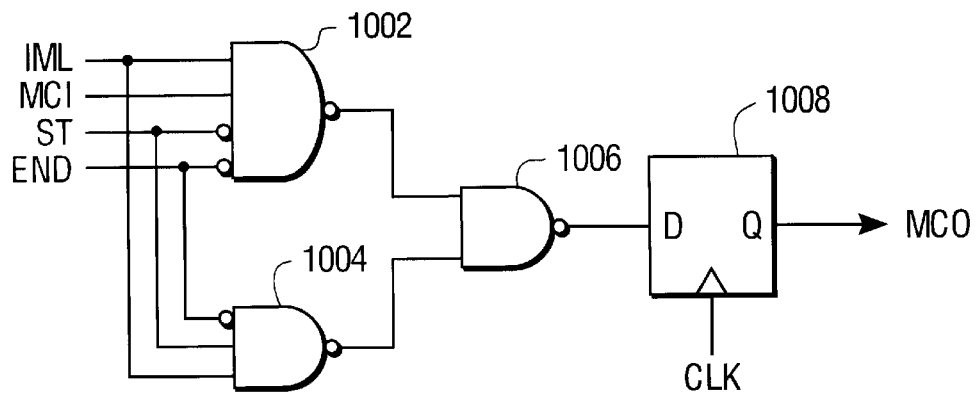
FIG. 10
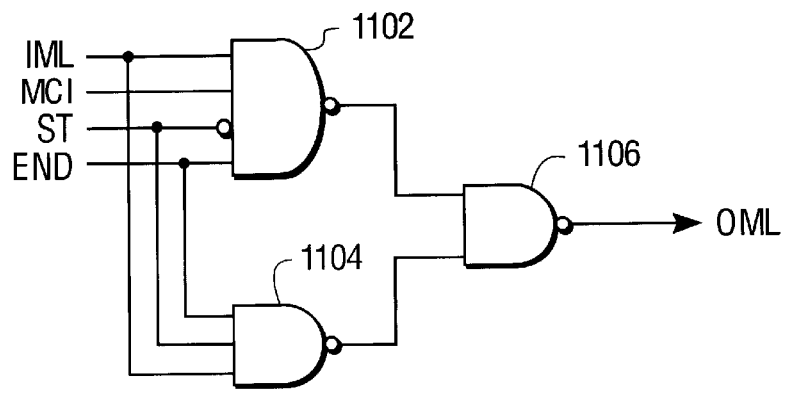
FIG. 11

| DFLT | FRST | CNT | LST | ST | MCO | OML |
|------|------|-----|-----|----|----|-----|
| 0 | 0 | 0 | 1 | 0 | 0 | IML·MCI |
| 0 | 0 | 1 | 0 | 0 | IML·MCI | 0 |
| 0 | 1 | 0 | 0 | 1 | IML | 0 |
| 1 | 0 | 0 | 0 | 1 | 0 | IML |
FIG. 13
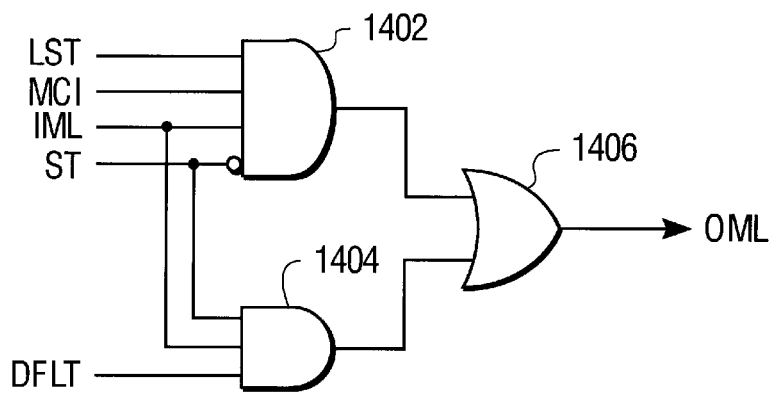
FIG. 14
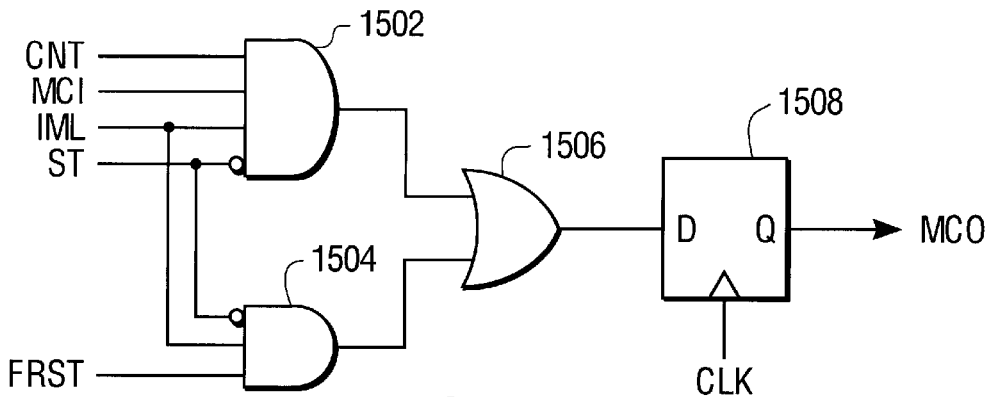
FIG. 15

| DFLT | FRST | CNT | LST | END | MCO | OML |
|------|------|-----|-----|-----|-----|-----|
| 0 | 0 | 0 | 1 | 1 | 0 | IML•MCI |
| 0 | 0 | 1 | 0 | 0 | IML•MCI | 0 |
| 0 | 1 | 0 | 0 | 0 | IML | 0 |
| 1 | 0 | 0 | 0 | 1 | 0 | IML |
FIG. 16
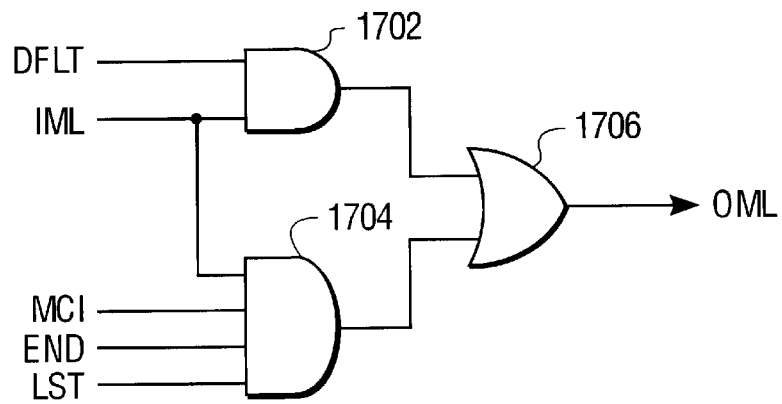
FIG. 17
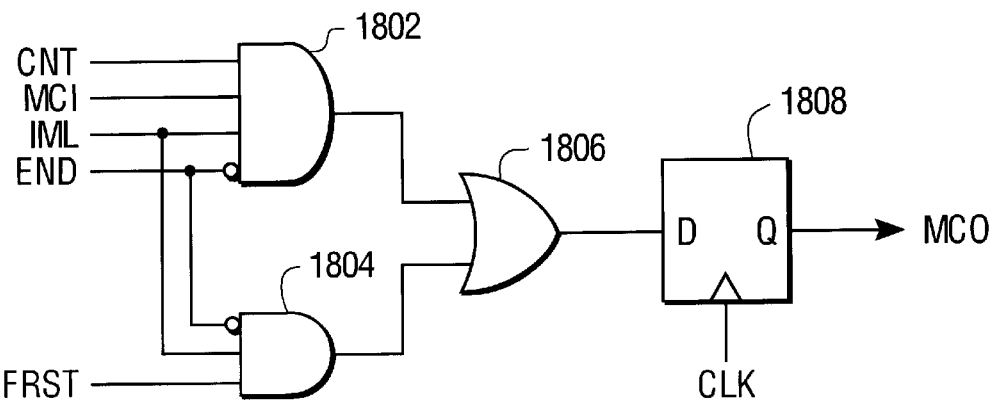
FIG. 18

FIG. 20

| Class Info | Data Words | | |
|---|---|---|---|
| 2 | FW | } | 2002 |
| 2 | LW | | |
| 4 | FW | } | 2004 |
| 4 | CW | | |
| 4 | CW | | |
| 4 | LW | | |
| 2 | FW | } | 2006 |
| 2 | LW | | |

| Class Info | Data Words | | |
|---|---|---|---|
| 1 | FW | } | 2102 |
| 1 | LW | | |
| 1 | FW | } | 2103 |
| 1 | LW | | |
| 2 | FW | } | 2104 |
| 2 | LW | } | 2105 |
| 2 | FW | } | 2106 |
| 2 | LW | } | 2107 |

← 2100

| Data Word Chain | Cam Address | | | Memory Address | | |
|---|---|---|---|---|---|---|
| | CA2 | CA1 | CA0 | MA2 | MA1 | MA0 |
| 2210 | 0 | 0 | 0 | 0 | 0 | 0 |
| 2210 | 0 | 0 | 1 | 0 | 0 | 0 |
| 2210 | 0 | 1 | 0 | 0 | 0 | 0 |
| 2210 | 0 | 1 | 1 | 0 | 0 | 0 |
| 2212 | 1 | 0 | 0 | 0 | 0 | 1 |
| 2212 | 1 | 0 | 1 | 0 | 0 | 1 |
| 2212 | 1 | 1 | 0 | 0 | 0 | 1 |
| 2212 | 1 | 1 | 1 | 0 | 0 | 1 |

FIG. 24

| Data Word Chain | Cam Address | | | Memory Address | | |
|---|---|---|---|---|---|---|
| | CA2 | CA1 | CA0 | MA2 | MA1 | MA0 |
| 0 | 0 | 0 | 0 | 0 | 0 | 0 |
| 0 | 0 | 0 | 1 | 0 | 0 | 0 |
| 1 | 0 | 1 | 0 | 0 | 0 | 1 |
| 1 | 0 | 1 | 1 | 0 | 0 | 1 |
| 2 | 1 | 0 | 0 | 0 | 1 | 0 |
| 2 | 1 | 0 | 1 | 0 | 1 | 0 |
| 3 | 1 | 1 | 0 | 0 | 1 | 1 |
| 3 | 1 | 1 | 1 | 0 | 1 | 1 |

INTER-ROW CONFIGURABILITY OF CONTENT ADDRESSABLE MEMORY

FIELD OF THE INVENTION

The present invention relates generally to content addressable memories (CAMs), and more particularly to inter-row configurability of a CAM array.

BACKGROUND

A content addressable memory (CAM) system is a storage system that can be instructed to compare a specific pattern of comparand data with data stored in its associative CAM array. The entire CAM array, or segments thereof, is searched in parallel for a match with the comparand data. The CAM device typically includes a priority encoder to translate the highest priority matching location into a match address or CAM index.

The CAM array has rows of CAM cells that each stores a number of bits of a data word. U.S. Pat. No. 5,440,715 describes a technique for expanding the width of the data words beyond that of a single row of CAM cells. Multiple data words can be width expanded together to form a data line. It appears, however, that the CAM system of the '715 patent will not always output the correct match address. For example, assume a first data line of two data words ZY is stored in data words 0 and 1, respectively, and a second data line of two data words WZ is stored in data words 2 and 3, respectively. When a comparand data line of WZ is provided for comparison, the first cycle compare with W will indicate a match with data word 2 only. The second cycle compare with Z will indicate a match with data words 0 and 3 and match lines ML0 and ML3 will be activated. When the priority encoder is enabled, it will output a match address of 0 instead of 3 since ML0 is the highest priority match line.

Additionally, it appears that the CAM system of the '715 patent will not always function correctly when each data line has different numbers of data words. For example, assume that a data line of 5 words VWXYZ is loaded into data word locations 0–4, and a data line of 4 words VWXY is loaded into data word locations 5–8. When a comparand data line of VWXY is provided to the CAM array, ML3 and ML8 will both be activated and the priority encoder will incorrectly output an address of three that stores the last word of a five word data line and not the last word of a four word entry.

It would be desirable to have an improved technique of width expanding data words in a CAM array.

SUMMARY OF THE INVENTION

A CAM system for storing a data word chain having a sequence of one or more data words stored in one or more rows of CAM cells is disclosed. For one embodiment, the CAM system includes a plurality of rows of CAM cells each for storing a data word in a data word chain, a plurality of match lines each coupled to a corresponding row of CAM cells, and a plurality of width expansion logic circuits each having a match line input coupled to a match line of a corresponding row of CAM cells, a match line output, a match carry output, a match carry input, and a plurality of control inputs for receiving a plurality of control signals. The match carry output of one of the width expansion logic circuits is coupled to the match carry input of another one of the width expansion logic circuits. The control signals are for determining the operation of the width expansion logic circuits and for indicating when a first data word and a last data word of the data word chain are provided for comparison with the data word of each of the rows of CAM cells. The control signals may also indicate when a continuing data word is provided for comparison with the rows of CAM cells. The continuing data word is a data word between the first and last data word in the data word chain. For one embodiment, the control signals are generated by an instruction decoder in response to decoding separate instructions for comparing the first data word, a continuing data word, and the last data word of a data word chain. The width expansion logic circuits control how and when the match results are provided to a priority encoder, and how and when match results are communicated to each other.

For one embodiment, each row of CAM cells may also include CAM cells for storing classification information that uniquely identifies each data word chain, or that identifies the number of data words in each data word chain. For another embodiment, each row of CAM cells may also include CAM cells for storing control bits that indicate when the data stored in the row of CAM cells is the first, last, or a continuing data word in the data word chain. The control bits may be one or more of a start bit that indicates the first data word, an end bit that indicates the last data word, a continuing bit that indicates a continuing data word, or a default bit that indicates that the row of CAM cells stores a data word that belongs to a data word chain that is only one entry wide. For other embodiments, only one of these four bits may be used in conjunction with the width expansion logic circuits, or the four bits may be encoded to only two bits to represent the four possible types of data words. For one embodiment, the CAM system can store and operate on data word chains of different lengths.

Other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which:

FIG. 2 is a functional table of one embodiment of the function of the start and end bits of FIG. 1;

FIG. 3 is a truth table of one embodiment of the operation of the width expansion logic circuits of the CAM array of FIG. 1;

FIG. 9 is a truth table of one embodiment of the operation of the width expansion logic circuits of the FIG. 8;

FIG. 10 is a logic diagram of one embodiment of the match carry logic of the width expansion logic circuit for the truth table of FIG. 9;

FIG. 11 is a logic diagram of one embodiment of the match result logic of the width expansion logic circuit for the truth table of FIG. 9;

FIG. 13 is a truth table of one embodiment of the operation of the width expansion logic circuits of the FIG. 12 when the control bit is a start bit;

FIG. 14 is a logic diagram of one embodiment of the match result logic of the width expansion logic circuit for the truth table of FIG. 12 when the control bit is a start bit;

FIG. 15 is a logic diagram of one embodiment of the match carry logic of the width expansion logic circuit for the truth table of FIG. 13 when the control bit is a start bit;

FIG. 16 is a truth table of one embodiment of the operation of the width expansion logic circuits of the FIG. 12 when the control bit is an end bit;

FIG. 17 is a logic diagram of one embodiment of the match result logic of the width expansion logic circuit for the truth table of FIG. 16 when the control bit is an end bit;

FIG. 18 is a logic diagram of one embodiment of the match carry logic of the width expansion logic circuit for the truth table of FIG. 16 when the control bit is an end bit;

FIG. 20 is a block diagram of the CAM array of FIG. 19 in which the class information indicates the number of data words in each data word chain;

FIG. 21 is a block diagram of the CAM array of FIG. 19 in which the class information indicates a classification for each data word chain;

FIG. 24 is a truth table of one embodiment of translating CAM match addresses output by the priority encoder to a memory address for external memory;

DETAILED DESCRIPTION

Figure 1:
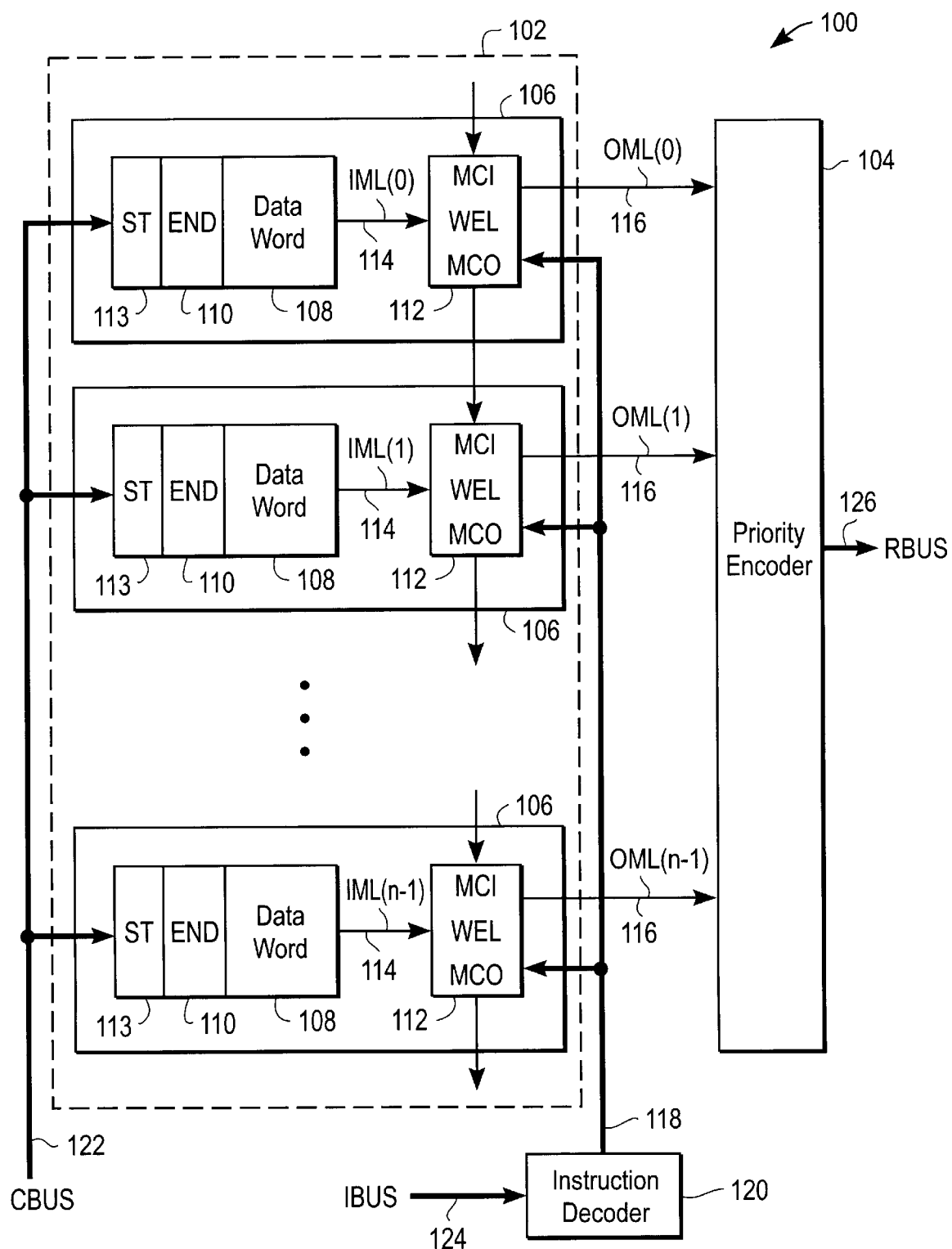
FIG. 1 is a block diagram of one embodiment of a CAM system including a CAM array having width expansion logic circuits and CAM rows each having a start and end control bit.

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Additionally, the prefix symbol "/" or the suffix "B" attached to signal names indicates that the signal is an active low signal. Each of the active low signals may be changed to active high signals as generally known in the art.

A CAM system for storing a data word chain having a sequence of one or more data words stored in one or more rows of CAM cells is disclosed. For one embodiment, the CAM system includes a plurality of rows of CAM cells each for storing a data word in a data word chain, a plurality of match lines each coupled to a corresponding row of CAM cells, and a plurality of width expansion logic circuits each having a match line input coupled to a match line of a corresponding row of CAM cells, a match line output, a match carry output, a match carry input, and a plurality of control inputs for receiving a plurality of control signals. The match carry output of one of the width expansion logic circuits is coupled to the match carry input of another one of the width expansion logic circuits. The control signals are for determining the operation of the width expansion logic circuits and for indicating when a first data word and a last data word of the data word chain are provided for comparison with the data word of each of the rows of CAM cells. The control signals may also indicate when a continuing data word is provided for comparison with the rows of CAM cells. The continuing data word is a data word between the first and last data word in the data word chain. For one embodiment, the control signals are generated by an instruction decoder in response to decoding separate instructions for comparing the first data word, a continuing data word, and the last data word of a data word chain. The width expansion logic circuits control how and when the match results are provided to a priority encoder, and how and when match results are communicated to each other.

For one embodiment, each row of CAM cells may also include CAM cells for storing classification information that uniquely identifies each data word chain, or that identifies the number of data words in each data word chain. For another embodiment, each row of CAM cells may also include CAM cells for storing control bits that indicate when the data stored in the row of CAM cells is the first, last, or a continuing data word in the data word chain. The control bits may be one or more of a start bit that indicates the first data word, an end bit that indicates the last data word, a continuing bit that indicates a continuing data word, or a default bit that indicates that the row of CAM cells stores a data word that belongs to a data word chain that is only one entry wide. For other embodiments, only one of these four bits may be used in conjunction with the width expansion logic circuits, or the four bits may be encoded to only two bits to represent the four possible types of data words. For one embodiment, the CAM system can store and operate on data word chains of different lengths.

The inter-row configurability of the CAM systems described herein enables a single CAM array to store and maintain multiple tables. For example, in a first section of the CAM array each CAM row can store default data words for a table that only needs narrower entries, while a second section of the CAM array can combine multiple CAM rows to store data word chains for tables requiring longer and wider entries. Additionally, the configurability of the CAM array allows a CAM array of N rows to be configured on data word boundaries to store data word chains having from one to N data words.

FIG. 1 is a block diagram of one embodiment of a CAM system 100 according to the present invention. CAM system 100 includes a CAM array 102, instruction decoder 120, and priority encoder 104. CAM array 102 has any number of entries of rows 106 that each includes a row of CAM cells and a width expansion logic circuit (WEL) 112. The CAM cells in each row 106 include a first group of CAM cells for storing a data word 108. The data word can be part of a variable length data word chain that sequentially spans one or more rows 106. Any number of different length data word chains may be stored within CAM array 102.

Each row 106 also includes CAM cells for storing control bits including a start bit (ST) 113 and an end bit (END) 110. The start bit indicates that the corresponding data word 108 is the first data word of a data word chain that includes a sequence of one or more data words. The end bit indicates that the corresponding data word 108 is the last data word of a data word chain. The start bit and end bit can be further encoded, as shown in FIG. 2, to indicate that the corresponding data word is a continuing data word or a default data word. A continuing data word is an intermediate data word between the first and last data words in a data word chain. A default data word corresponds to a data word chain that has only one data word. Other encodings may be used including treating each default word as the last data word of a single word data word chain, and using separate control bits (e.g., 3 or 4) for each data word type. The data word, start bit and end bit may be stored in any type of CAM cells including binary or ternary CAM cells. The data words, start bits and end bits may be written into the CAM array over CBUS 122.

The width expansion logic circuits 112 control when and how match results are communicated with each other and to priority encoder 104. Each width expansion logic circuit has a match input, a match output, a match carry input and a match carry output. The match input receives a match result from the corresponding row of CAM cells on an intermediate match line (IML) 114. This match result on IML 114 may be directly output, or combined with match results from previous rows, to the match output on output match line (OML) 116 and/or the match carry output (MCO) of each width expansion logic circuit. The match carry output of each width expansion logic circuit provides a match carry output signal to the match carry input (MCI) of a width expansion logic circuit in the next row such that match results are serially transmitted down the array (i.e., from lowest address to highest address) from row to row. Alternatively, the match carry output of each width expansion logic circuit is connected to the match carry input of a width expansion logic circuit in the previous row such that previous match results are serially transmitted up the array (i.e., from highest address to lowest address) from row to row. The first (or last) width expansion logic circuit may have its match carry input connected to a predetermined state that indicates a match. The match output provides a match output signal to priority encoder 104 on output match line 116. The state of the match output signal and the match carry output signal is determined by (1) the operating mode of the width expansion logic circuit, (2) the match results on the intermediate match lines IML 114, and (3) whether the previous (or next) row has a match (e.g., when comparing a comparand data word chain that spans more than one data word).

Which operation is performed by the width expansion logic circuits is determined by match control signals provided on signal lines 118 by instruction decoder 120. Instruction decoder 120 generates the match control signals in response to receiving four uniquely coded compare instructions on IBUS 124. For another embodiment, the match control signals may be provided directly to signal lines 118 without being processed by the instruction decoder. As shown in FIG. 3, four instructions may be used to generate four separate match control signals for comparing a default word (DFLT), comparing the first word of a data word chain (FRST), comparing a continuing word of a data word chain (CNT), and comparing the last data word of a data word chain (LST). Alternatively, two encoded match control signals may be used to represent the four different types of compare operations. Each width expansion logic circuit generates a match carry output signal and a match output signal in response to the match control signals, the match results on the intermediate match lines IML 114 and the signal on its match carry input as shown in FIG. 3.

Figure 4:
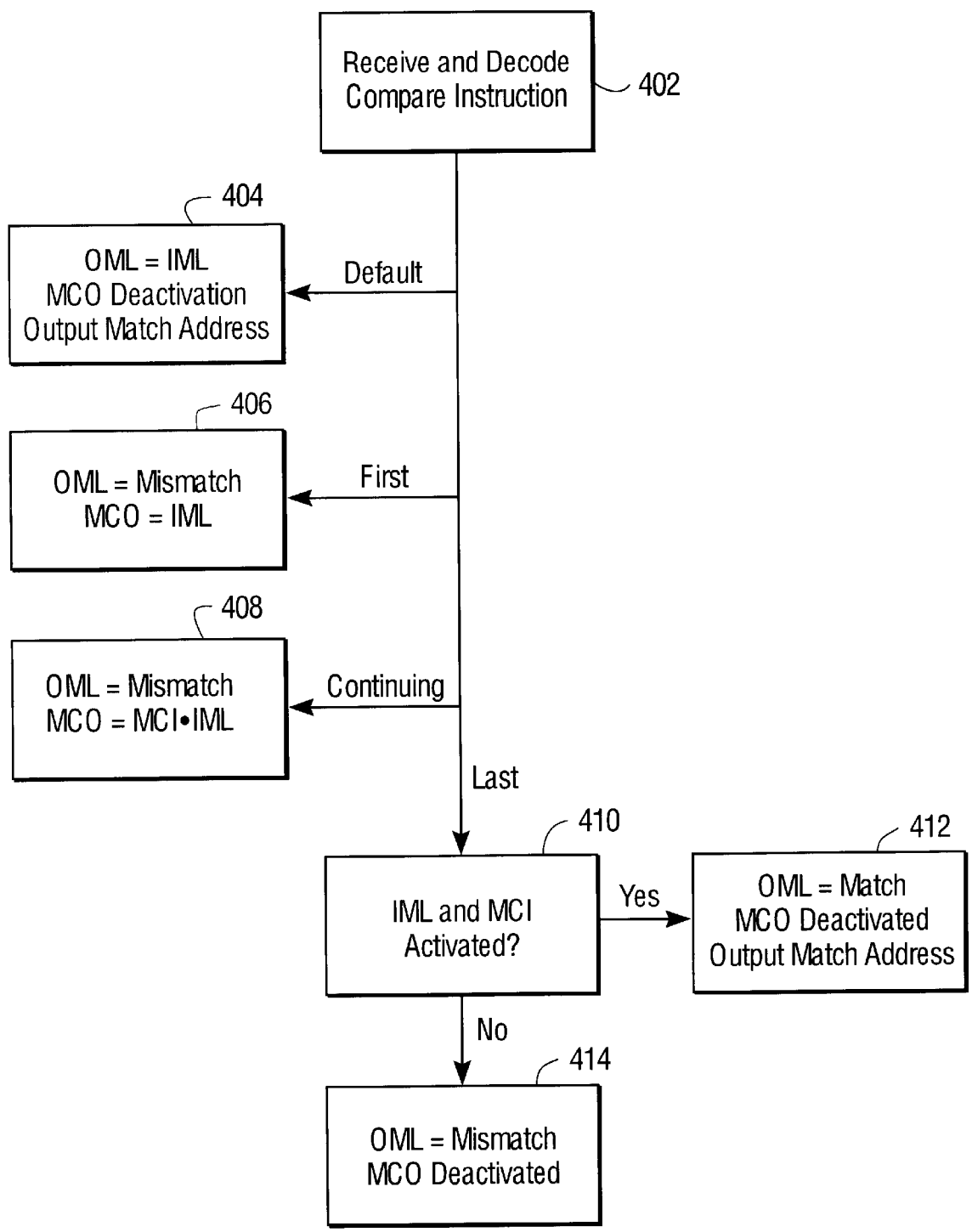
FIG. 4 is one embodiment of the operation of the CAM system of FIG. 1.

An example of the operation of CAM system 100 and FIG. 3 is shown in FIG. 4. Assume that CAM array 102 is already loaded with data word chains having either the default word size of one row or having multiple data words spanning more than one row. In this embodiment, all data word chains may be the same size, different sizes or combinations thereof. Initially, at step 402, a compare instruction is received by instruction decoder 120. Comparand data is supplied on CBUS 122 for simultaneous comparison with the data words, start bits and end bits of each row in the CAM array. For this embodiment, each comparand data word has the start and end bits also supplied on the CBUS to indicate which type of comparand data is provided for comparison. For alternative embodiments, the start and end bits may be generated by the instruction decoder in response to decoding the corresponding compare instruction.

Instruction decoder 120 decodes the compare instruction provided on IBUS 124. If the instruction is a default compare instruction, DFLT is activated and each width expansion logic circuit (1) asserts its match carry output signal to an inactive state and (2) asserts its match output signal to the same logical state as the match result indicated on the corresponding intermediate match lines IML 114

(step 404). Only the rows that have default word entries will have their match results provided to the priority encoder for resolution because the comparand data includes the start and end bits that participate in the comparison. Priority encoder 104 will then determine the address of the highest priority matching entry and output the CAM match address or index to RBUS 126.

If the compare instruction indicates that the comparand data is the first data word of a data word chain having more than one data word (step 406), each width expansion logic circuit asserts its match output signal to a mismatch state, regardless of the comparison result on its corresponding intermediate match line, so that the priority encoder will not generate an incorrect match address. For an alternative embodiment, each width expansion logic circuit does not assert its match output signal to a mismatch state. Additionally, each width expansion logic circuit asserts its match carry output signal to the logical state of its corresponding intermediate match line to propagate this match result to the next width expansion logic circuit.

If the compare instruction indicates that the comparand data is a continuing data word of a data word chain (step 408), each width expansion logic circuit asserts its match output signal to a mismatch state, again regardless of the comparison result on its corresponding intermediate match line, so that the priority encoder will not generate an incorrect match address. For an alternative embodiment, each width expansion logic circuit does not assert its match output signal to a mismatch state. Additionally, each width expansion logic circuit asserts its match carry output signal to the logical combination of the states of its corresponding intermediate match line and the match carry input. If both are activated, the data word chain stored in the CAM array has matched the comparand data word chain from the first data word through this continuing data word, and a match result is propagated to the next width expansion logic circuit. If, however, either the corresponding intermediate match line or the match carry input is deactivated, then a mismatch has occurred in the data word chain and a mismatch condition is propagated to the next width expansion logic circuit.

Finally, if the compare instruction indicates that the comparand data is the last data word of a data word chain, each width expansion logic circuit asserts is match output signal to a match state if (1) its match carry input is activated indicating that all previous data words in the data word chain matched corresponding data word in the comparand data word chain, and (2) if its own intermediate match line is activated indicating a match (steps 410 and 412). The priority encoder may then output the correct address of the highest priority entry only after all data words in a data word chain have been compared. If, however, either the match carry input is deactivated indicating a previous mismatch in the data word chain, or the corresponding intermediate match line is deactivated indicating a mismatch of the last data word, the match output signal is deactivated indicating a mismatch for the stored data word chain with the comparand data word chain (steps 410 and 414).

Figure 5:
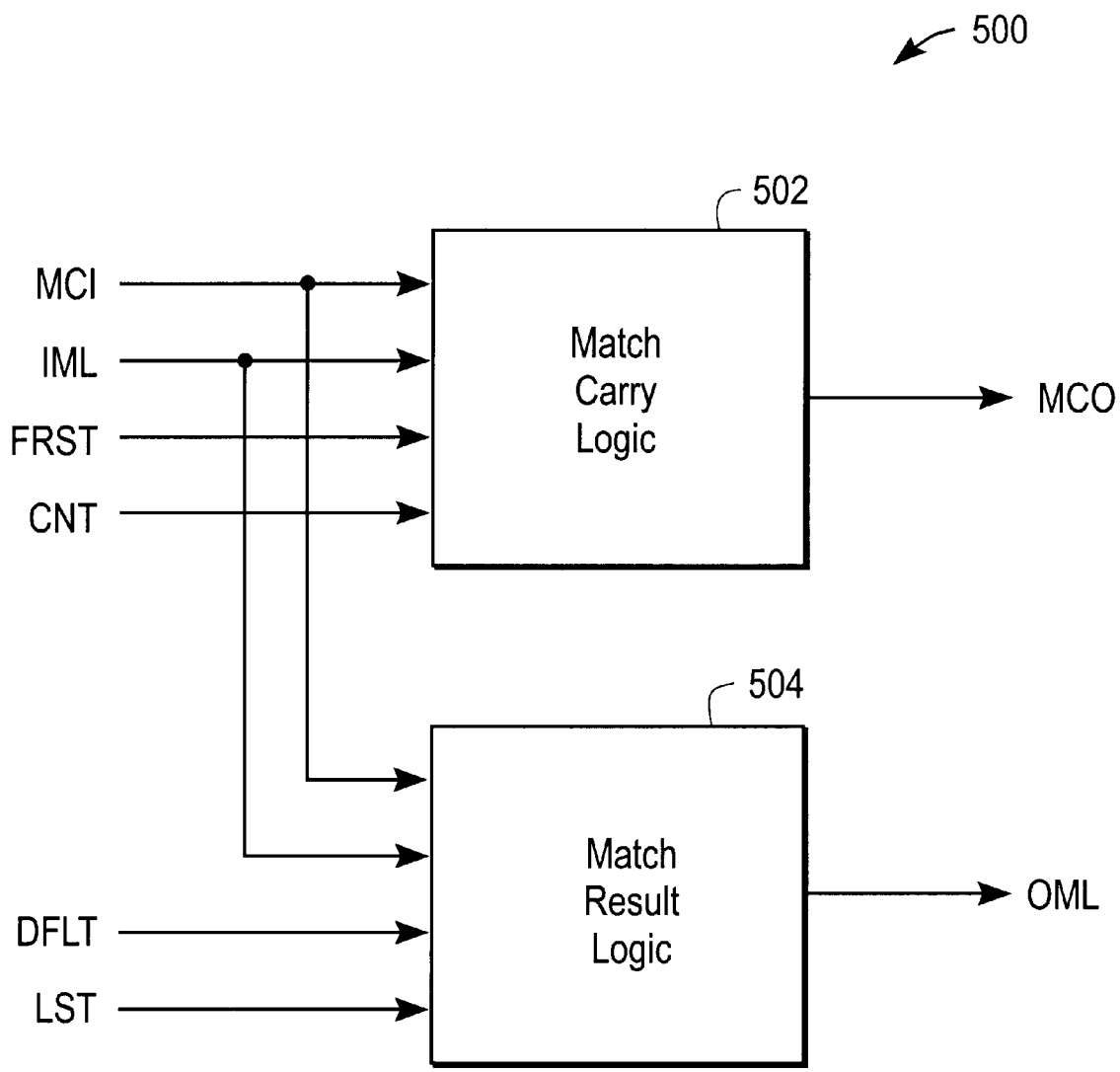
FIG. 5 is a block diagram of one embodiment of a width expansion logic circuit of FIG. 1 including match carry logic and match result logic.

FIG. 5 is a block diagram of width expansion logic 500 that is one embodiment of the width expansion logic circuits 112 of FIG. 1. Width expansion logic circuit 500 includes match carry logic 502 and match result logic 504. Match carry logic 502 generates the match carry output signal in response to the match carry input signal from MCI, the match result on intermediate match line IML 114, and match control signals FRST and CNT as indicated in FIGS. 3 and 4. Match result logic 504 generates the match output signal in response to the match carry input signal from MCI, the match result on intermediate match line IML 114, and match control signals DFLT and LST as indicated in FIGS. 3 and 4. Any logic may be used to generate signals MCO and OML in accordance with FIGS. 3 and 4 including those that logically complement one of more of the signals in FIG. 3. For other embodiments, the four match control signals may be encoded into two match control signals and the inputs to match carry logic 502 and match result logic 504 adjusted accordingly.

Figure 6:
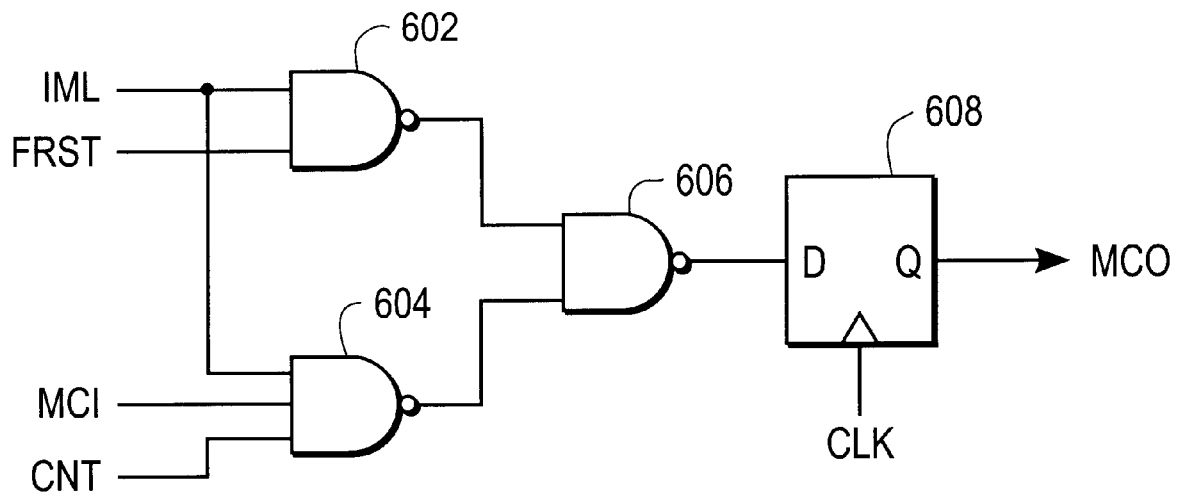
FIG. 6 is a logic diagram of one embodiment of the match carry logic of FIG. 5.

FIG. 6 is a logic diagram of one embodiment of match carry logic 502 implemented with NAND logic gates. Other embodiments may be used to implement match carry logic 502 with other logic gate configurations. The match carry logic of FIG. 6 includes NAND gate 602 having a first input coupled to IML, a second input coupled to FRST, and an output coupled to the first input of NAND gate 606. NAND gate 604 has a first input coupled to IML, a second input coupled to MCI, a third input coupled to CNT, and an output coupled to the second input of NAND gate 606. The output of NAND gate 606 is coupled to the data input of latch 608. The data output of latch 608 is coupled to MCO. Latch 608 is used to provide the match carry output signal to the next width expansion logic circuit at a predetermined time. For other embodiments, latch 608 may be omitted.

Figure 7:
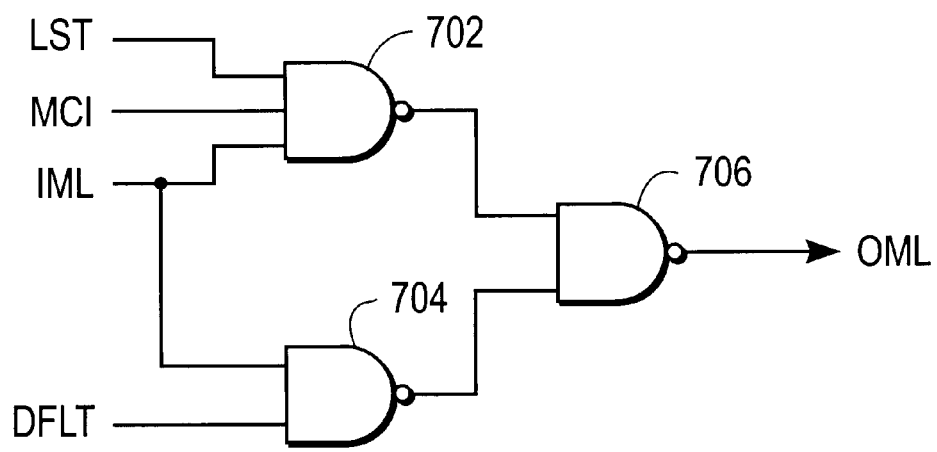
FIG. 7 is a logic diagram of one embodiment of the match result logic of FIG. 5.

FIG. 7 is a logic diagram of one embodiment of match result logic 504 implemented with NAND logic gates. Other embodiments may be used to implement match result logic 504 with other logic gate configurations. The match result logic of FIG. 7 includes NAND gate 702 having a first input coupled to LST, a second input coupled to MCI, a third input coupled to IML, and an output coupled to the first input of NAND gate 706. NAND gate 704 has a first input coupled to IML, a second input coupled to DFLT, and an output coupled to the second input of NAND gate 706. The output of NAND gate 706 provides the match output signal.

Figure 8:
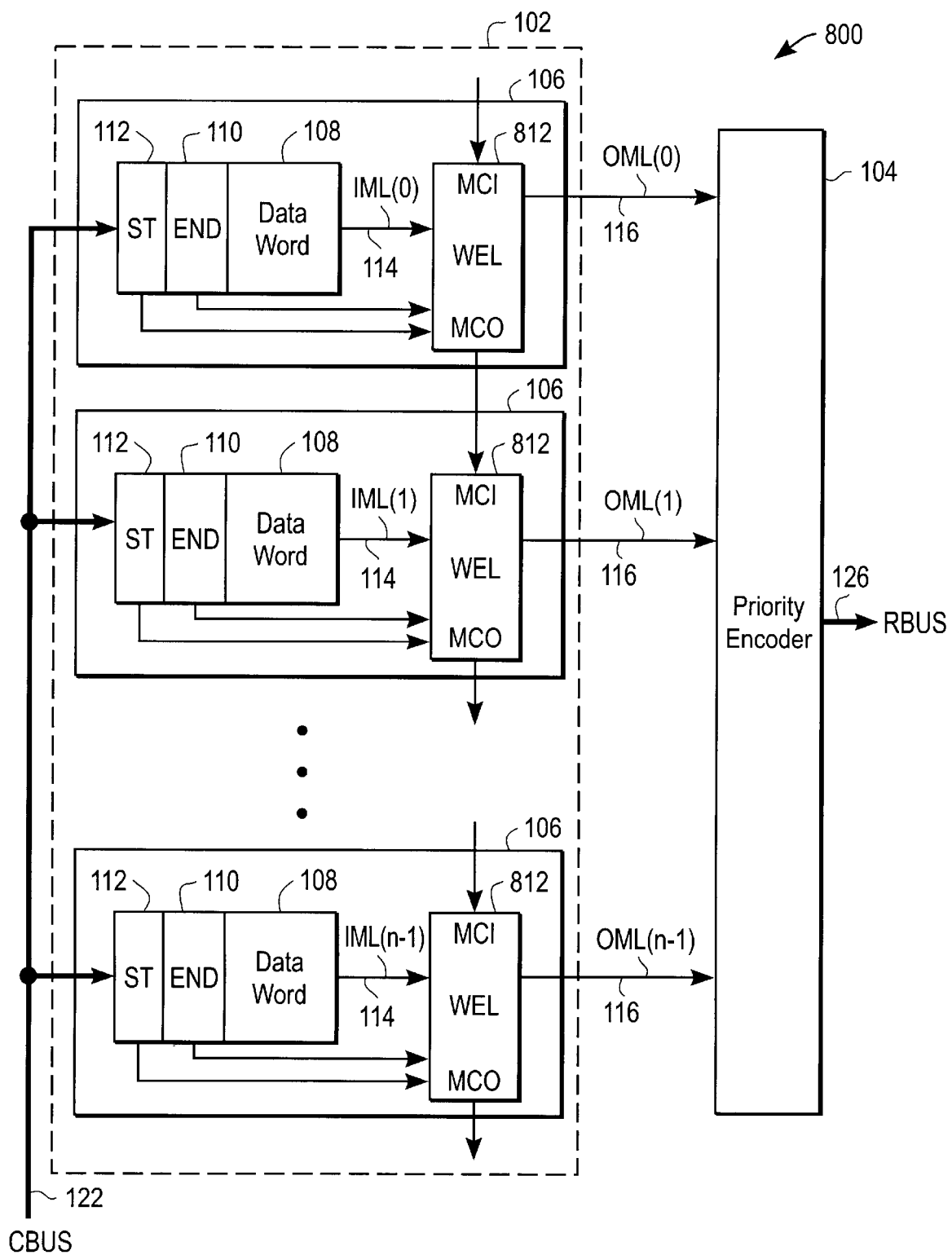
FIG. 8 is a block diagram of another embodiment of a CAM system including a CAM array having width expansion logic circuits coupled to start and end bits of corresponding CAM rows.

FIG. 8 is a block diagram of CAM system 800 according to another embodiment of the present invention. For this embodiment, the start and end bits are directly provided to the width expansion logic circuits 812 instead of the match control signals. The width expansion logic circuits 812 operate similarly to width expansion logic circuits 112 of FIG. 1, except that they use the start and end bits as control signals to determine the logical states of MCO and OML. For this embodiment, only one compare instruction may be used instead of the four separate compare instructions of CAM system 100. FIG. 9 shows one embodiment of a truth table for the operation of each width expansion logic circuit 812. Note that the logic states of MCO and OML are the same in response to the compare operations as they were for CAM system 100 of FIG. 1.

FIG. 10 is a logic diagram of one embodiment of match carry logic implemented with NAND logic gates for the truth table of FIG. 10. Other embodiments may be used to implement the match carry logic with other logic gate configurations. The match carry logic of FIG. 10 includes NAND gate 1002 having a first input coupled to IML, a second input coupled to MCI, a third input coupled to the logical complement of ST, a fourth input coupled to the logical complement of END, and an output coupled to the first input of NAND gate 1006. NAND gate 1004 has a first input coupled to IML, a second input coupled to ST, a third input coupled to the logical complement of END, and an output coupled to the second input of NAND gate 1006. The output of NAND gate 1006 is coupled to the data input of latch 1008. The data output of latch 1008 is coupled to MCO. Latch 1008 is used to provide the match carry output signal to the next width expansion logic circuit at a predetermined time. For other embodiments, latch 1008 may be omitted.

FIG. 11 is a logic diagram of one embodiment of match result logic implemented with NAND logic gates for the truth table of FIG. 10. Other embodiments may be used to implement the match result logic with other logic gate configurations. The match result logic of FIG. 11 includes NAND gate 1102 having a first input coupled to IML, a second input coupled to MCI, a third input coupled to the logical complement of ST, a fourth input coupled to END, and an output coupled to the first input of NAND gate 1106. NAND gate 1104 has a first input coupled to IML, a second input coupled to ST, a third input coupled to END, and an output coupled to the second input of NAND gate 1106. The output of NAND gate 1106 provides the match output signal.

For another embodiment of CAM system 100, each of the match control signals DFLT, FRST, CNT, and LST may be stored as control bits in the CAM rows and provided directly to the width expansion logic circuits instead of the start and end bits of FIG. 8. For yet another embodiment, the control signals DFLT, FRST, CNT, LST, ST and/or END may be stored in other memory elements for each CAM row and not in CAM cells.

Figure 12:
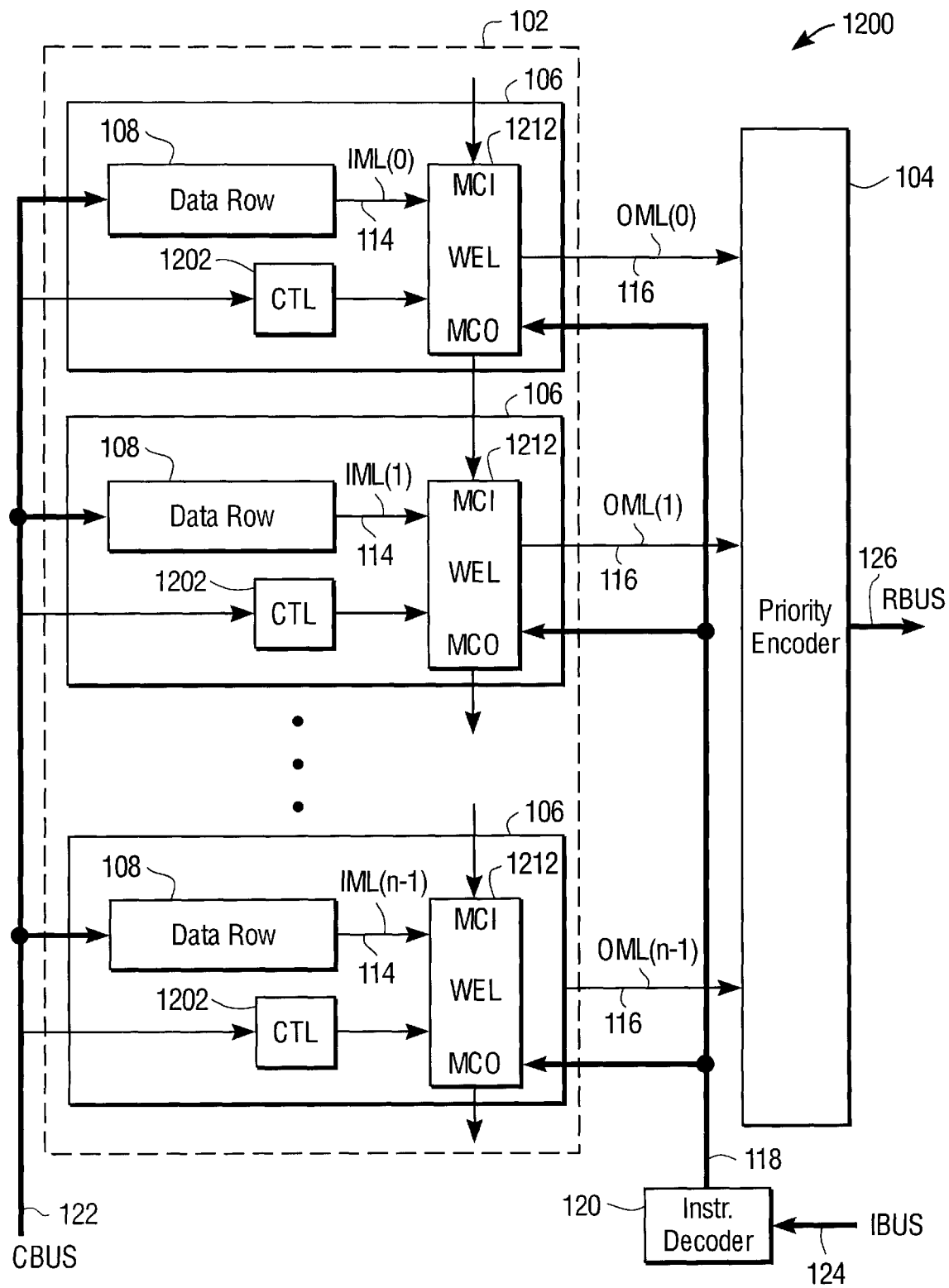
FIG. 12 is a block diagram of another embodiment of a CAM system including a CAM array having width expansion logic circuits coupled to a control bit.

FIG. 12 is a block diagram of CAM system 1200 according to another embodiment of the present invention. For this embodiment, a single control bit CTL is provided to width expansion logic circuits 812. Width expansion logic circuits 1212 operate similarly to width expansion logic circuits 112 of FIG. 1, except that they use the single CTL bit together with the match control signals of FIG. 1 to determine the logical states of MCO and OML. CTL is stored in a separate memory element apart from the rows of CAM cells. For an alternative embodiment, CTL may also be included in the CAM cell row. CTL may be either the start or end bit. For another embodiment, CTL may be logically combined (e.g., by an AND or OR gate) with the match output signal from a width expansion logic circuit 112 of FIG. 1 prior to providing the match carry output signal to priority encoder 104.

FIG. 13 shows one embodiment of a truth table for the operation of each width expansion logic circuit 1212 when the CTL bit is the start bit. For this embodiment, the start bit is written to an active state for default data words and first data words of data word chains. Note that the logic states of MCO and OML are the same in response to the compare operations as they were for CAM system 100 of FIG. 1.

FIG. 14 is a logic diagram of one embodiment of match result logic implemented with AND/OR logic gates for the truth table of FIG. 13. Other embodiments may be used to implement the match result logic with other logic gate configurations. The match result logic of FIG. 14 includes AND gate 1402 having a first input coupled to IML, a second input coupled to MCI, a third input coupled to the logical complement of ST, a fourth input coupled to LST, and an output coupled to the first input of OR gate 1406. AND gate 1404 has a first input coupled to IML, a second input coupled to ST, a third input coupled to DFLT, and an output coupled to the second input of OR gate 1406. The output of OR gate 1406 provides the match output signal.

FIG. 15 is a logic diagram of one embodiment of match carry logic implemented with AND/OR logic gates for the truth table of FIG. 13. Other embodiments may be used to implement the match carry logic with other logic gate configurations. The match carry logic of FIG. 15 includes AND gate 1502 having a first input coupled to IML, a second input coupled to MCI, a third input coupled to the logical complement of ST, a fourth input coupled to CNT, and an output coupled to the first input of OR gate 1506.

AND gate 1504 has a first input coupled to IML, a second input coupled to ST, a third input coupled to FRST, and an output coupled to the second input of OR gate 1506. The output of OR gate 1506 is coupled to the data input of latch 1508. The data output of latch 1508 is coupled to MCO. Latch 1508 is used to provide the match carry output signal to the next width expansion logic circuit at a predetermined time. For other embodiments, latch 1508 may be omitted.

FIG. 16 shows one embodiment of a truth table for the operation of each width expansion logic circuit 1212 when the CTL bit is the end bit. For this embodiment, the end bit is written to an active state for default data words and last data words of data word chains. Note that the logic states of MCO and OML are the same in response to the compare operations as they were for CAM system 100 of FIG. 1.

FIG. 17 is a logic diagram of one embodiment of match result logic implemented with AND/OR logic gates for the truth table of FIG. 16. Other embodiments may be used to implement the match result logic with other logic gate configurations. The match result logic of FIG. 17 includes AND gate 1702 having a first input coupled to IML, a second input coupled to DFLT, and an output coupled to the first input of OR gate 1706. AND gate 1704 has a first input coupled to IML, a second input coupled to MCI, a third input coupled to END, a fourth input coupled to LST, and an output coupled to the second input of OR gate 1706. The output of OR gate 1706 provides the match output signal.

FIG. 18 is a logic diagram of one embodiment of match carry logic implemented with AND/OR logic gates for the truth table of FIG. 16. Other embodiments may be used to implement the match carry logic with other logic gate configurations. The match carry logic of FIG. 18 includes AND gate 1802 having a first input coupled to IML, a second input coupled to MCI, a third input coupled to the logical complement of END, a fourth input coupled to CNT, and an output coupled to the first input of OR gate 1806. AND gate 1804 has a first input coupled to IML, a second input coupled to the logical complement of END, a third input coupled to FRST, and an output coupled to the second input of OR gate 1806. The output of OR gate 1806 is coupled to the data input of latch 1808. The data output of latch 1808 is coupled to MCO. Latch 1808 is used to provide the match carry output signal to the next width expansion logic circuit at a predetermined time. For other embodiments, latch 1808 may be omitted.

Figure 19:
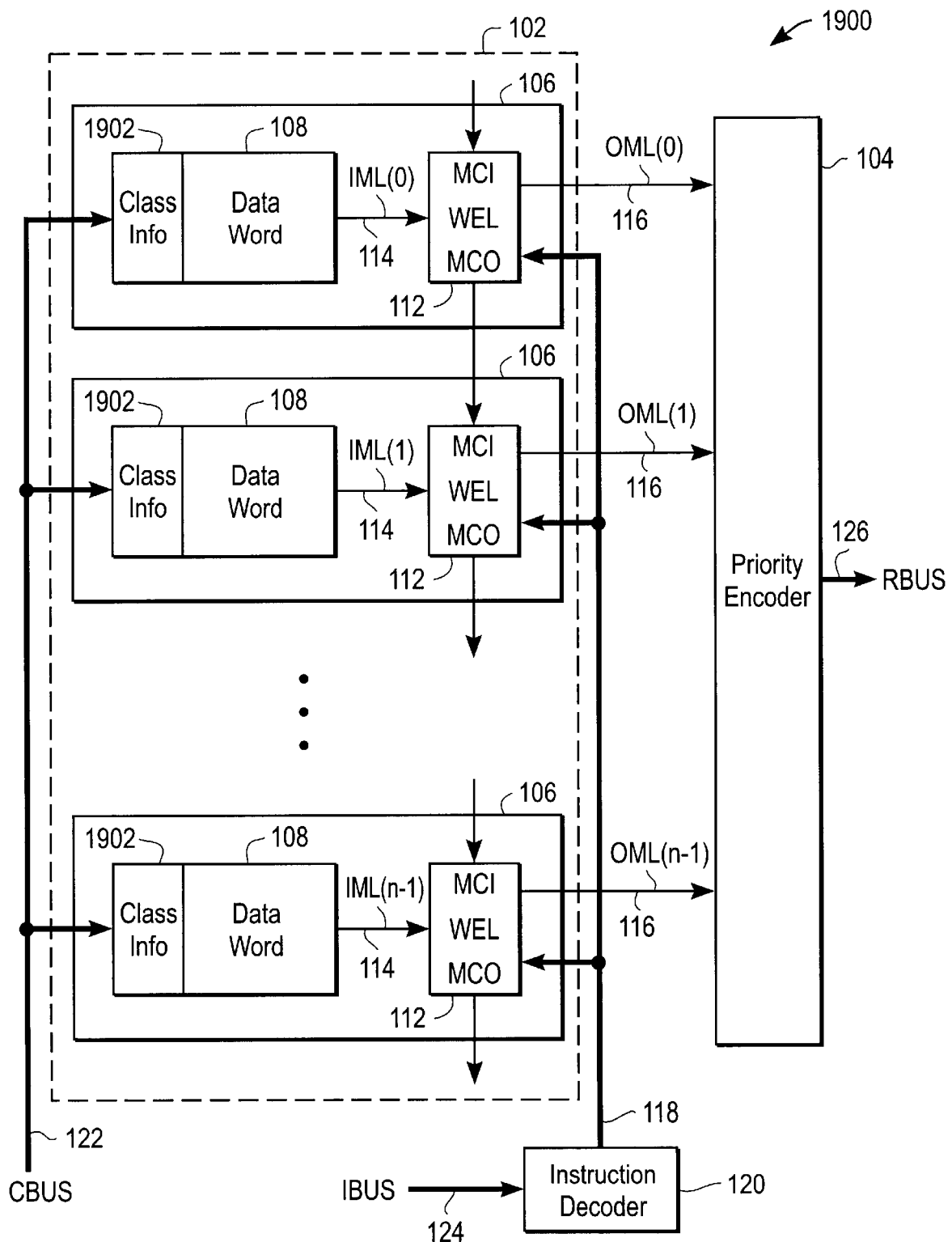
FIG. 19 is a block diagram of another embodiment of a CAM system including a CAM array having width expansion logic circuits and CAM rows each having classification information.

FIG. 19 is a block diagram of CAM system 1900 according to another embodiment of the present invention. For this embodiment, control bits that include classification information 1902 are used instead of control bits such as start and end bits. For one embodiment, the classification information is the number of data words or data bits of a corresponding data word chain. For example, FIG. 20 shows three data word chains 2002, 2004, and 2006 stored in a CAM array 2000, where the first data word of a data word chain is represented as "FW", a continuing data word is represented as "CW", and a last data word of a data word chain is represented as "LW". Data word chains 2002 and 2006 each include two data words and their associated class information thus indicates the number 2. Data word chain 2004 has four data words and has associated class information of 4. When a compare operation is performed, the class information is also compared as part of the comparand data to determine the match results on the intermediate match lines. For an alternative embodiment, the class information can indicate the number of data words in each data word chain by using a unique number for each data word chain that is different from the actual number of data words.

FIG. 21 shows another example of using class information. In this example, the class information stored in CAM array 2100 identifies the type of information stored in the data word chains 2102–2107. For example, each of data word chains 2102 and 2103 store information of type 1, while each of data word chains 2104–2107 store information of type 2. The class information for this embodiment may or may not also be related to the size of the data word chains. This embodiment may be used to store multiple tables in a single CAM array, and identify the table entries by their classification information. As in the example of FIG. 20, the classification information will participate in a comparison with comparand data and participate in the result on the intermediate match line.

Figure 22:
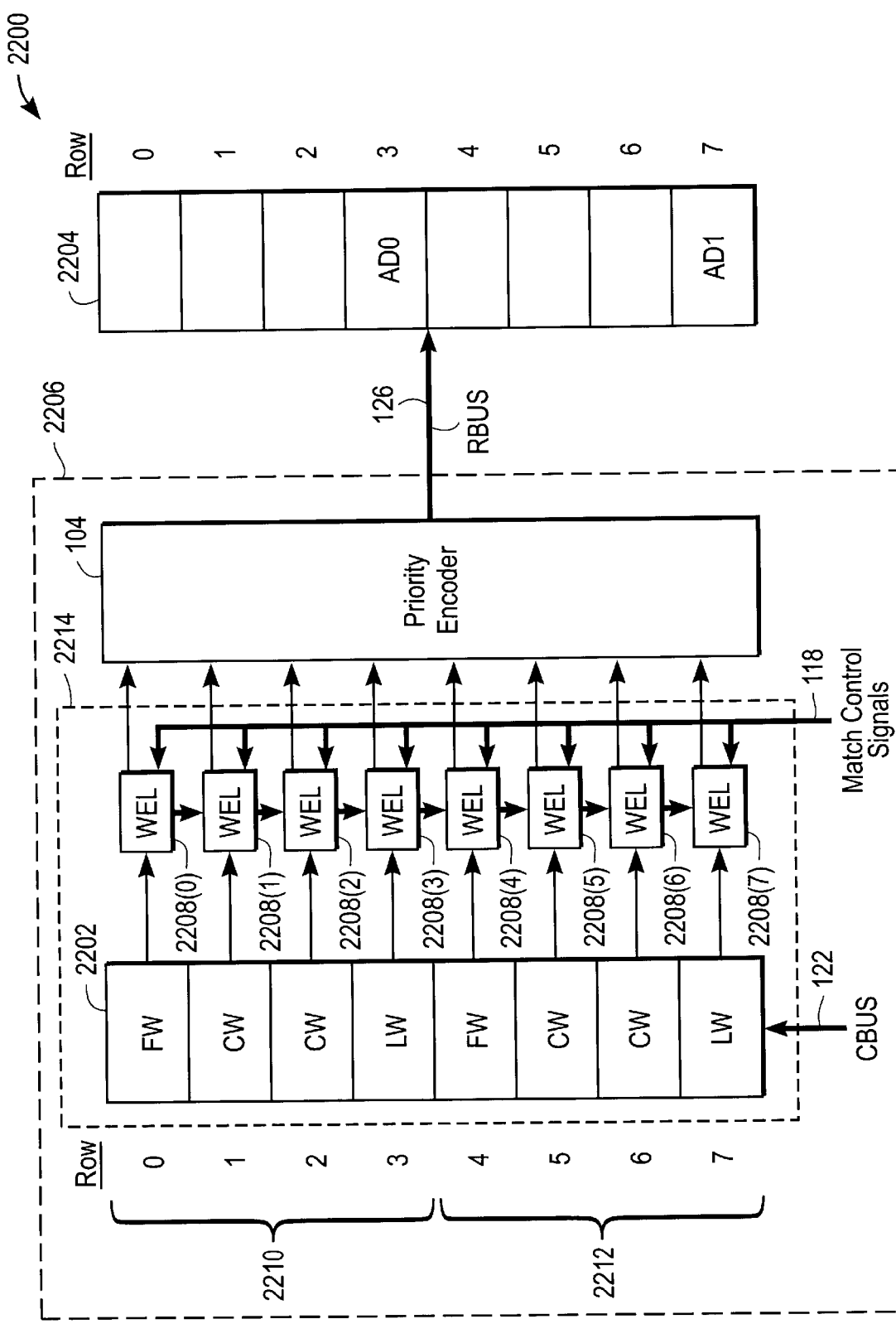
FIG. 22 is a block diagram of the CAM system of any the previous figures storing data word chains and having associated data stored in another memory at the same address as the last data word of a particular data word chain in the CAM system.

FIG. 22 shows an example of using the CAM systems of the previous embodiments. CAM system 2200 includes CAM system 2206 (that may be any of the previous embodiments discussed above) storing two data word chains each having four data words stored in CAM rows 2202 and communicating with width expansion logic circuits 2208. Each data word has associated information stored in a memory array 2204 such that data word chain 2210 has its corresponding associated data AD0 stored at memory address three of memory 2204, and data word chain 2212 has its corresponding associated data AD1 stored at memory address 7 of memory 2204. The associated data may be any type of information including forwarding information for packet information stored in CAM array 2214. In this example, data word chain 2210 is stored in rows 2202 in the order of FW to LW at CAM addresses 0–3, respectively, and data word chain 2212 is stored in rows 2202 in the order of FW to LW at CAM addresses 4–7, respectively. For alternative embodiments, the data word chains may be stored LW to FW. The first data word may be the most significant data word or the least data word, and the last data word may be the least significant data word or the most significant data word of the data word chain. If a comparand data word chain on CBUS 122 matches only data word chain 2210, width expansion logic circuit 2208(3) will activate its match output signal and priority encoder 104 will output a CAM match address of three to RBUS 126 to access associated data AD0. AD0 may also be stored at multiple addresses of memory 2204. The multiple addresses may be accessed starting or ending at address 3. Similarly, if a comparand data word chain on CBUS 122 matches only data word chain 2212, width expansion logic circuit 2208(7) will activate its match output signal and priority encoder 104 will output a CAM match address of seven to RBUS 126 to access associated data AD1.

Figure 23:
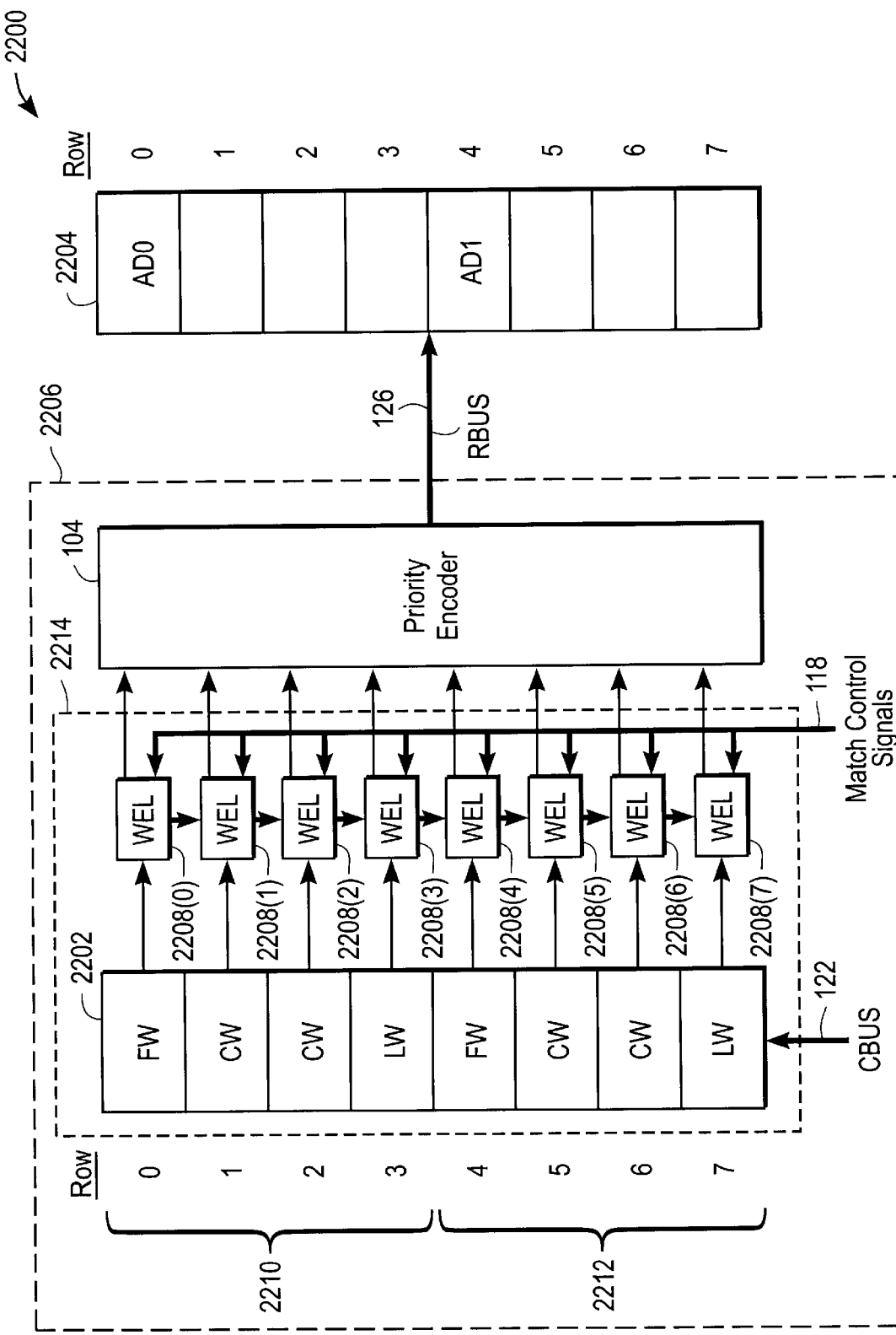
FIG. 23 is a block diagram of the CAM system of any the previous figures storing data word chains and having associated data stored in another memory at the same address as the first data word of a particular data word chain in the CAM system.

As shown in FIG. 23, associated data AD0 and AD1 may also be stored at memory addresses 0 and 4, respectively, of memory 2204. The CAM match addresses output on RBUS 126 can be translated to access memory addresses 0 and 4. For one embodiment, a block address scheme can be used to translate the CAM match addresses. For the example of FIG. 23, CAM addresses 0–7 can be represented by three address bits CA0–CA2. CA2 can be used as a block address such that address 0 will be accessed when a CAM match address of three (or 0–3) is output on RBUS 126, and memory address 4 will be accessed when a match address of four (or 4–7) is output on RBUS 126.

For an alternative embodiment, AD0 and AD1 may be stored at memory addresses 0 and 1, respectively, of memory 2204. The CAM match address bit C2 is connected to the memory address bit MA0 on the address inputs of memory 2204. FIG. 24 illustrates this translation. This scheme can be extended to accommodate any size of data word chain.

Figure 25:
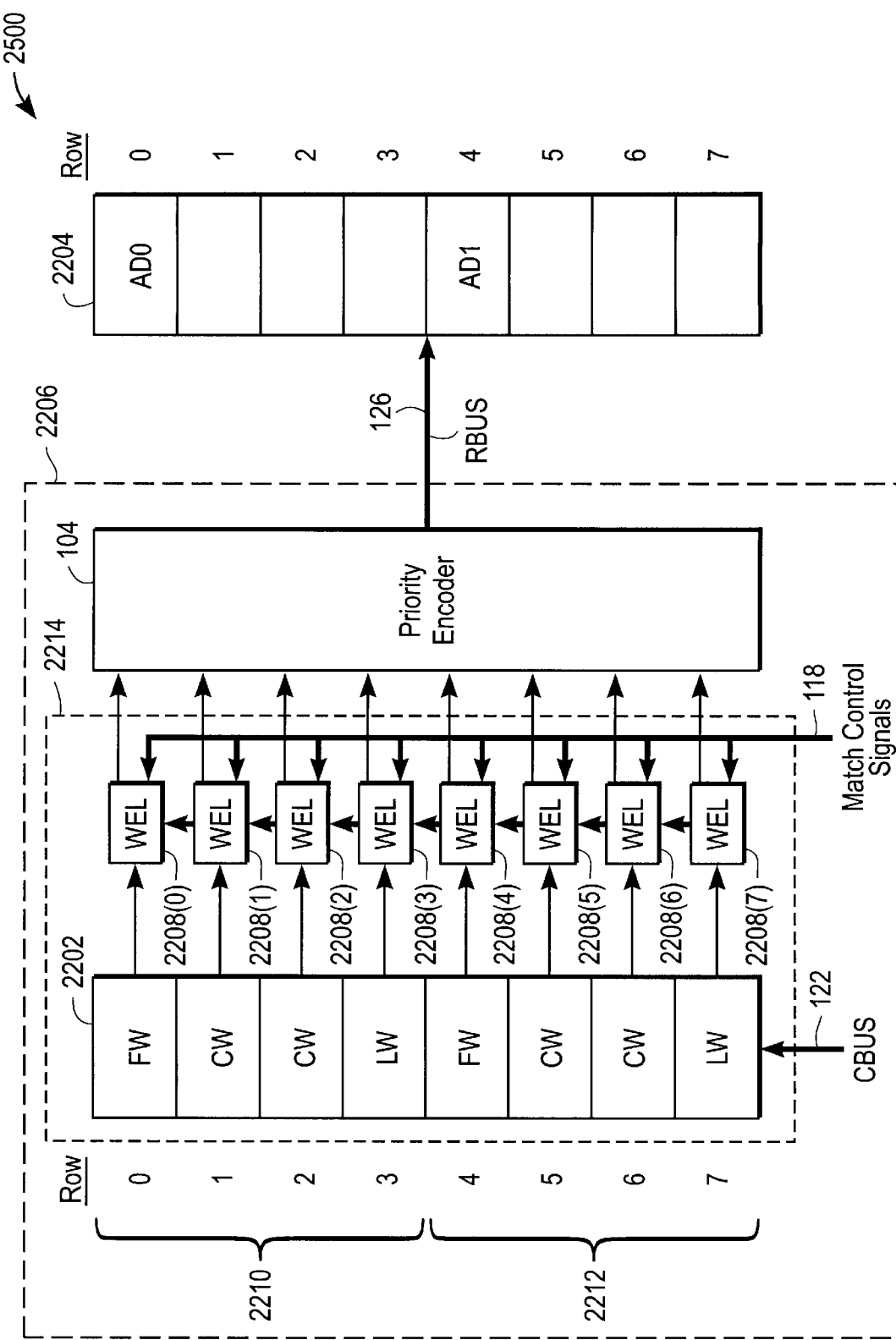
FIG. 25 is a block diagram of the CAM system of any the previous figures storing data word chains and having the width expansion logic circuits interconnected from the lowest to highest priority locations in the CAM array.
Figure 26A:
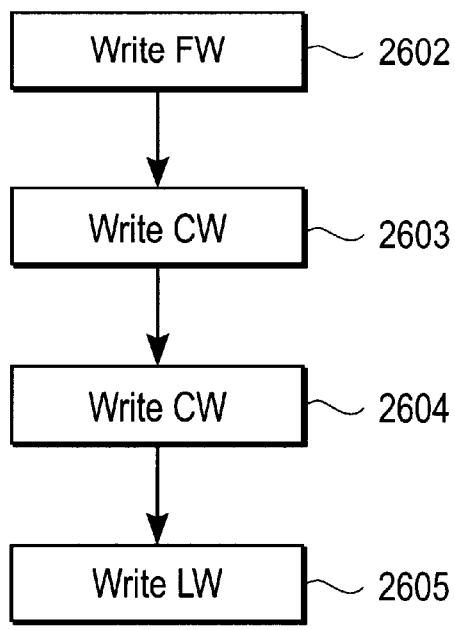
FIG. 26A is a flow chart for writing a data word chain into the CAM system of FIG. 25.
Figure 26B:
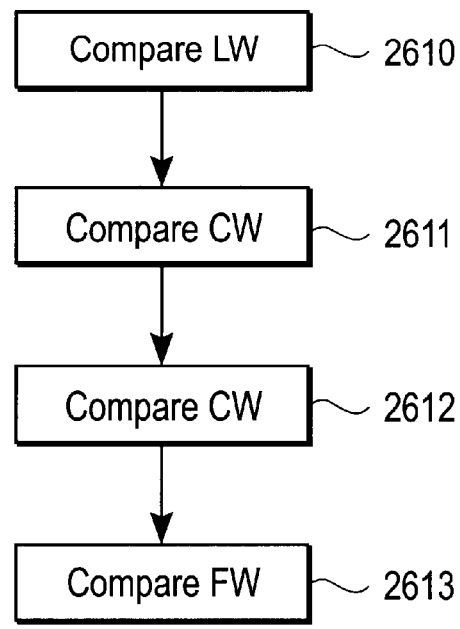
FIG. 26B is a flow chart for comparing comparand data word chains with the data word chains written into the CAM system of FIG. 25 in the sequence of the flow chart of FIG. 26A.

FIG. 25 shows another CAM system 2500 that is another embodiment for accessing AD0 and AD1 stored at memory addresses 0 and 4, respectively in memory 2204. For this embodiment, the data word chains 2210 and 2212 are written into CAM rows 2202 in the order of FW to LW starting at the lowest available address in CAM array 2214 as shown in steps 2602–2605 of FIG. 26A. Upon comparing, the comparand data word chain is provided for comparison in the order of LW to FW as shown in steps 2610–2613 of FIG. 26B. For this embodiment, the width expansion logic circuits are interconnected such that the match carry output of width expansion logic circuit 2808(7) is connected to the match carry input of width expansion logic circuit 2808(6), the match carry output of width expansion logic circuit 2808(6) is connected to the match carry input of width expansion logic circuit 2808(5), and so on until the match carry output of width expansion logic circuit 2808(1) is connected to the match carry input of width expansion logic circuit 2808(0). Thus, when a comparand data word chain matches data word chain 2210, width expansion logic circuit 2208(0) activates its match output signal and priority encoder 104 outputs a CAM match address of 0 to RBUS 126. The CAM match address can then be used to access AD0 at memory address 0 in memory 2204. Similarly, when a comparand data word chain matches data word chain 2212 (and not 2210), width expansion logic circuit 2208(4) activates its match output signal and priority encoder 104 outputs a CAM match address of 4 to RBUS 126. The CAM match address can then be used to access AD1 at memory address 4 in memory 2204.

Figure 28A:
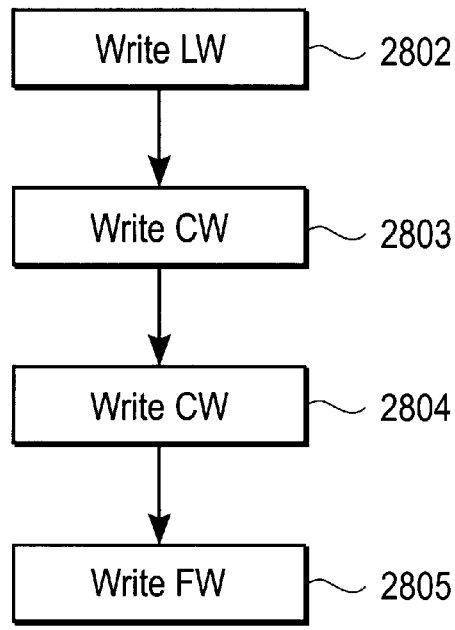
FIG. 28A is a flow chart for writing a data word chain into the CAM system of FIG. 27.
Figure 28B:
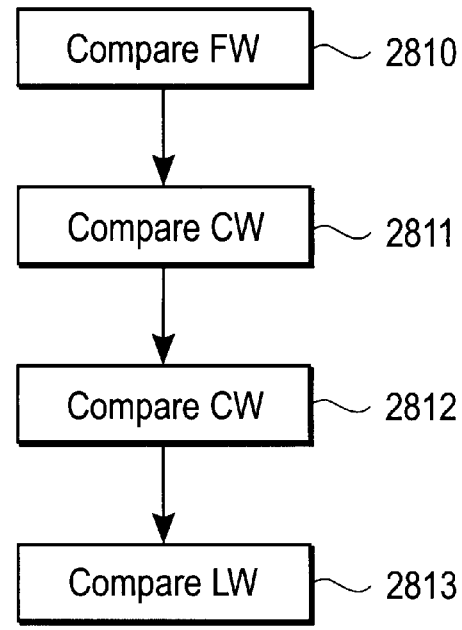
FIG. 28B is a flow chart for comparing comparand data word chains with the data word chains written into the CAM system of FIG. 25 in the sequence of the flow chart of FIG. 28A.
Figure 27:
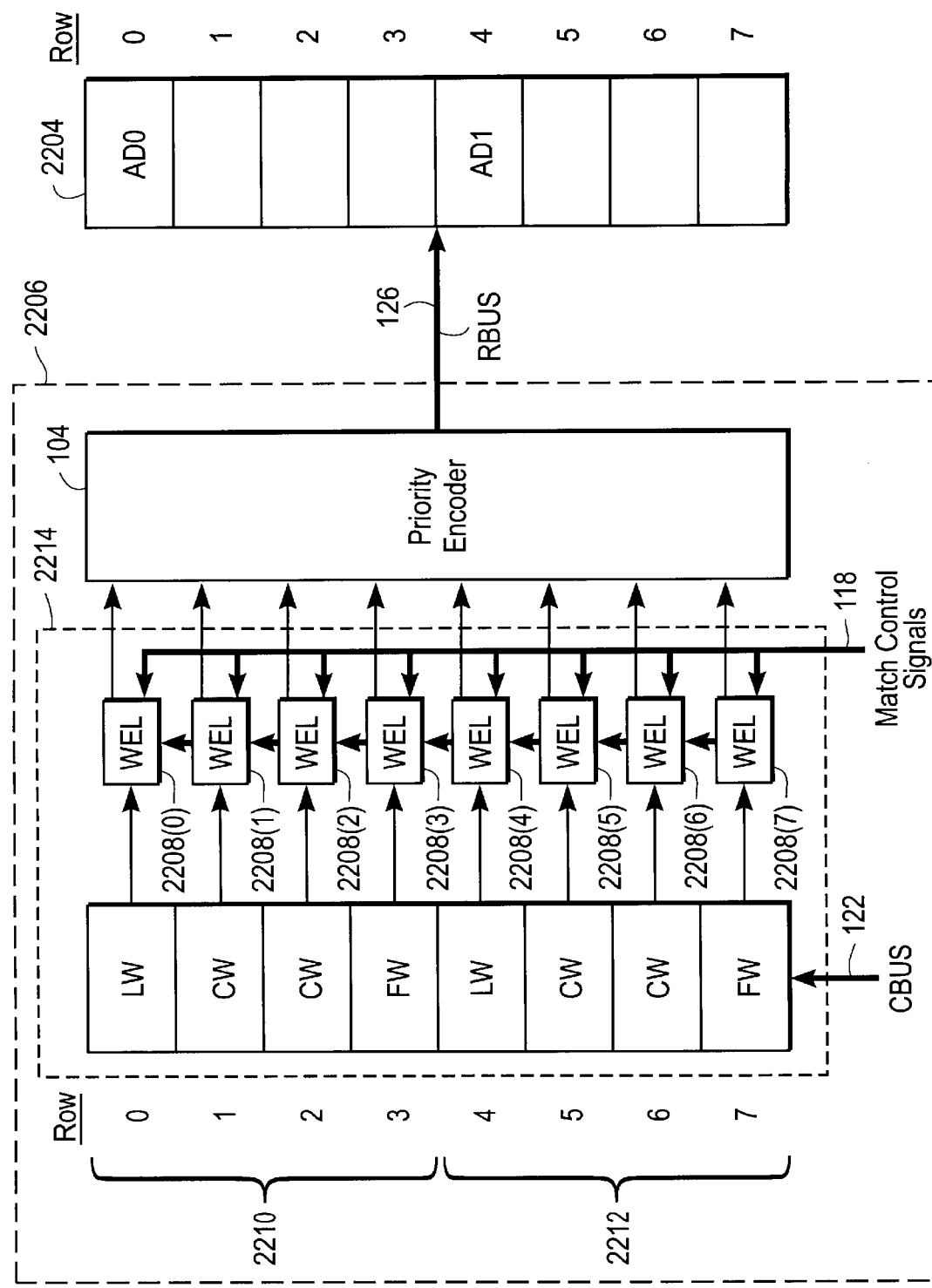
FIG. 27 is a block diagram of the CAM system of any the previous figures storing data word chains and having the width expansion logic circuits interconnected from the lowest to highest priority locations in the CAM array.

For an alternative embodiment of FIG. 25, the data word chains 2210 and 2212 may be written into CAM rows 2202 in the order of LW to FW as shown in FIG. 27 and steps 2802–2805 of FIG. 28A. Upon comparing, the comparand data word chain is provided for comparison in the order of FW to LW as shown in steps 2810–2813 of FIG. 28B.

Figure 29:
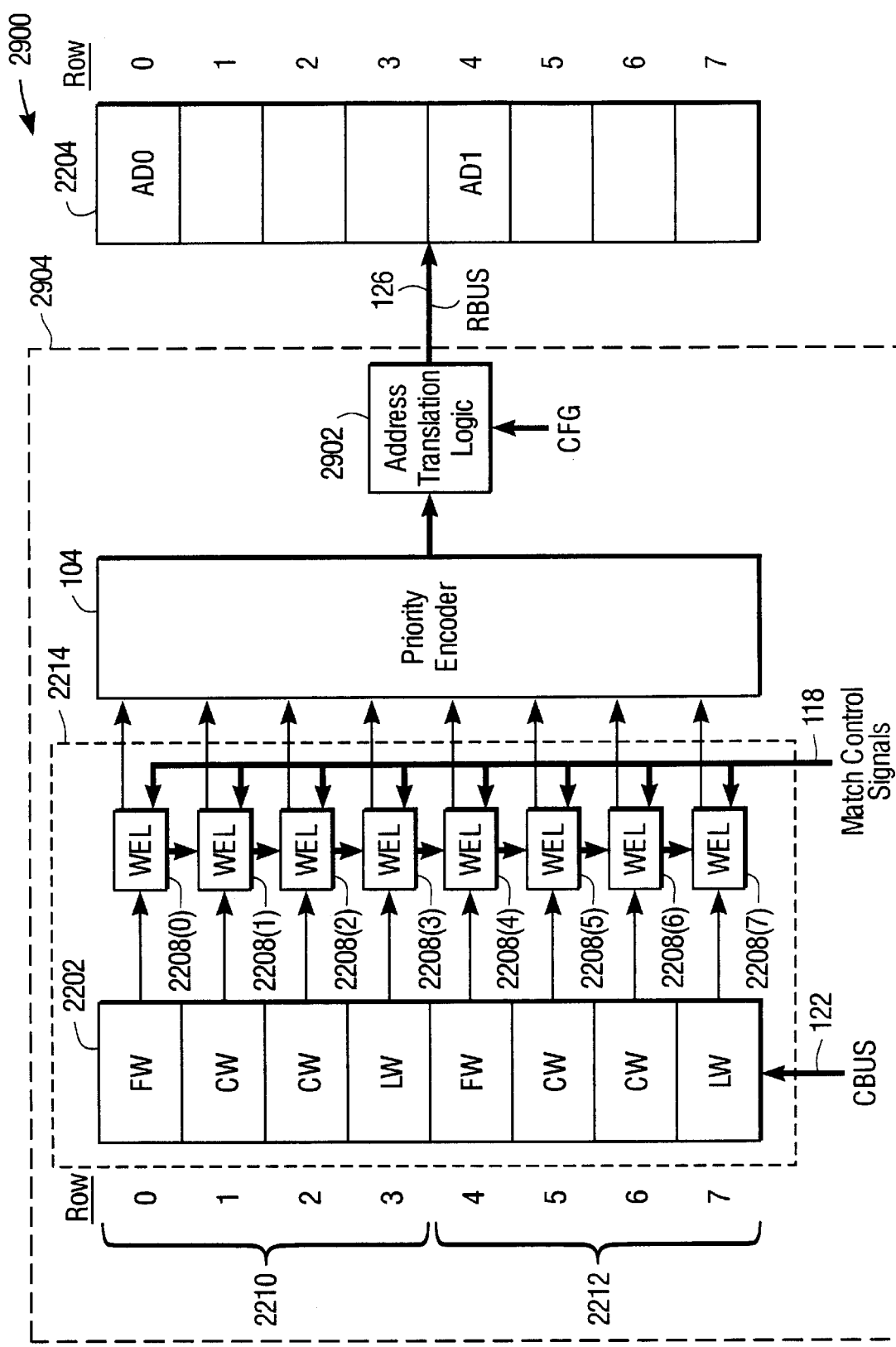
FIG. 29 is a block diagram of the CAM system of any the previous figures storing data word chains and having address translation logic for translating a CAM match address output by the priority encoder to a memory address for external memory.

FIG. 29 shows another CAM system 2900 that is another embodiment for accessing AD0 and AD1 stored at memory addresses 0 and 4, respectively in memory 2204. For this embodiment, the data word chains 2210 and 2212 are written into CAM rows 2202 in the order of FW to LW starting at the lowest available address in CAM array 2214, and comparand data word chains are compared in the same order FW to LW. For this embodiment, CAM system 2904 includes address translation logic 2902 that translates CAM match addresses of data word chains 2210 and 2212 to memory addresses in memory 2204 of corresponding associated data AD0 and AD1. For example, if data word chain 2210 matches a comparand data word chain, width expansion logic 2208(3) will activate its match output signal and priority encoder 104 will generate a CAM match address of three. Address translation logic 2902 will then translate the CAM match address of three to memory address 0 of memory 2204 where AD0 is stored. Similarly, if data word chain 2212 matches a comparand data word chain (and data word chain 2210 does not match) width expansion logic 2208(7) will activate its match output signal and priority encoder 104 will generate a CAM match address of seven. Address translation logic 2902 will then translate the CAM match address of three to memory address 4 of memory 2204 where AD1 is stored. For alternative embodiments, the associated data may be stored in any location of memory 2204 and address translation logic 2902 may perform the necessary translation. Address translation logic 2902 translates the address from priority encoder 104 to an address for memory 2204 in response to configuration signals CFG that indicate the size of the translation. The configuration signals may be, for example, the number of data words for one or more of the data word chains, or information on how to determine block addresses for memory 2204.

Figure 30:
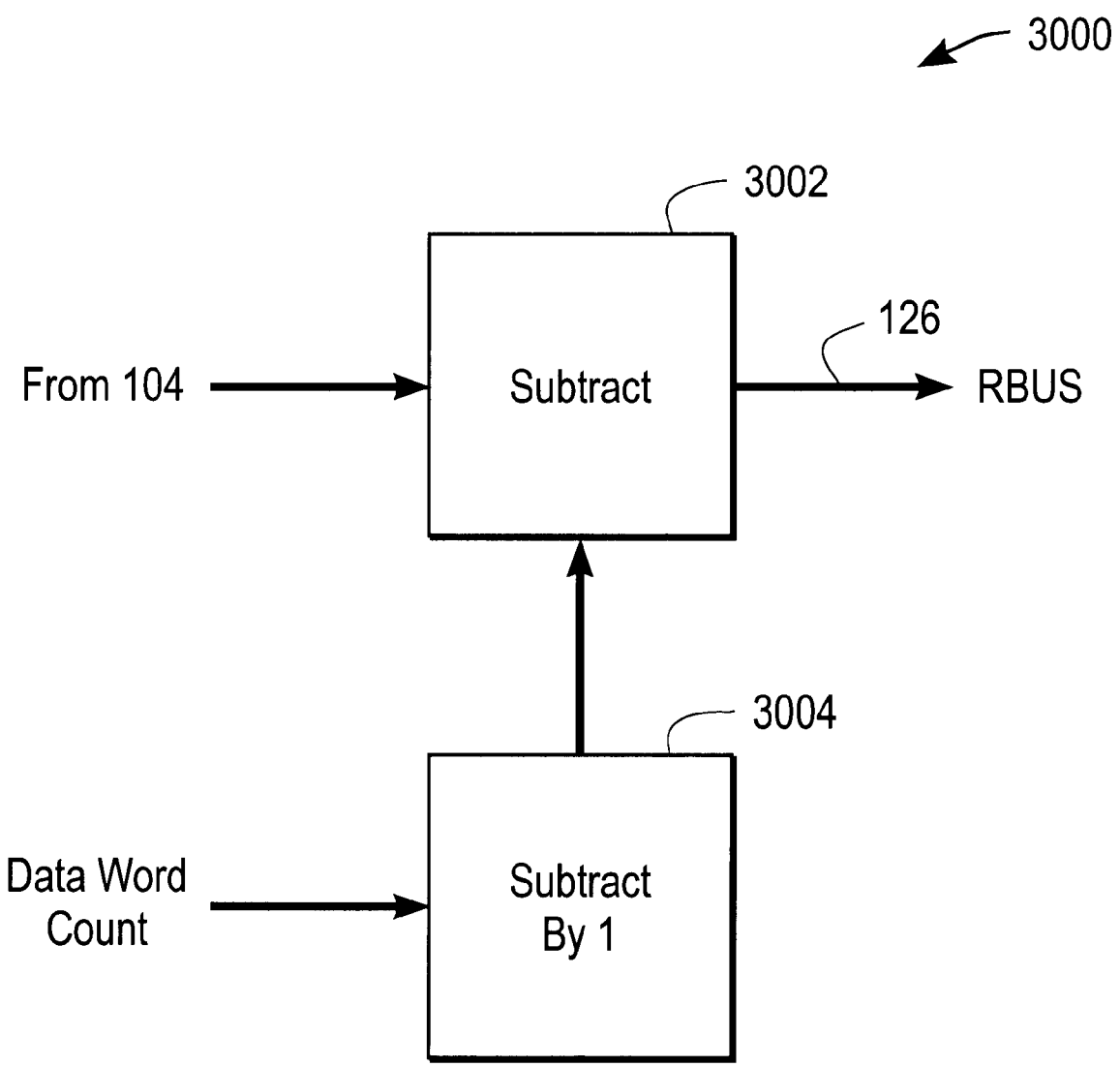
FIG. 30 is a block diagram of one embodiment of the address translation logic of FIG. 29.

FIG. 30 is a block diagram of subtractor logic 3000 that is one embodiment of address translation logic 2902 of FIG. 29. The data word count or size of the data words in the data word chains is provided to subtract by 1 logic 3004 as the configuration information. Subtract by 1 logic 3004 subtracts one from this count and provides the result to subtract logic 3002. Subtract logic 3002 subtracts this value from the match address provided by priority encoder 104, and outputs a new match address to RBUS 126 to access memory 2204. For example, if data word chain 2210 matches the comparand data word chain, width expansion logic circuit 2208 (3) activates its match output signal and priority encoder 104 outputs a CAM match address of three to subtract logic 3002. The data word count in this example is 4 since the comparand data word chain and the matching data word chain 2210 each have four data words. Subtract by 1 logic 3004 thus outputs three to subtract logic 3002, and the subtract logic outputs an address of zero to RBUS 126 to access AD0 at memory address zero in memory 2204. The data word count can be loaded with the comparand data word chain or previously programmed into the CAM system. For another embodiment, subtract by 1 logic 3004 may be omitted and the data word count directly provided to subtract logic 3002 as one less than the number of data words in the comparand data word chain.

Figures 31, 32:
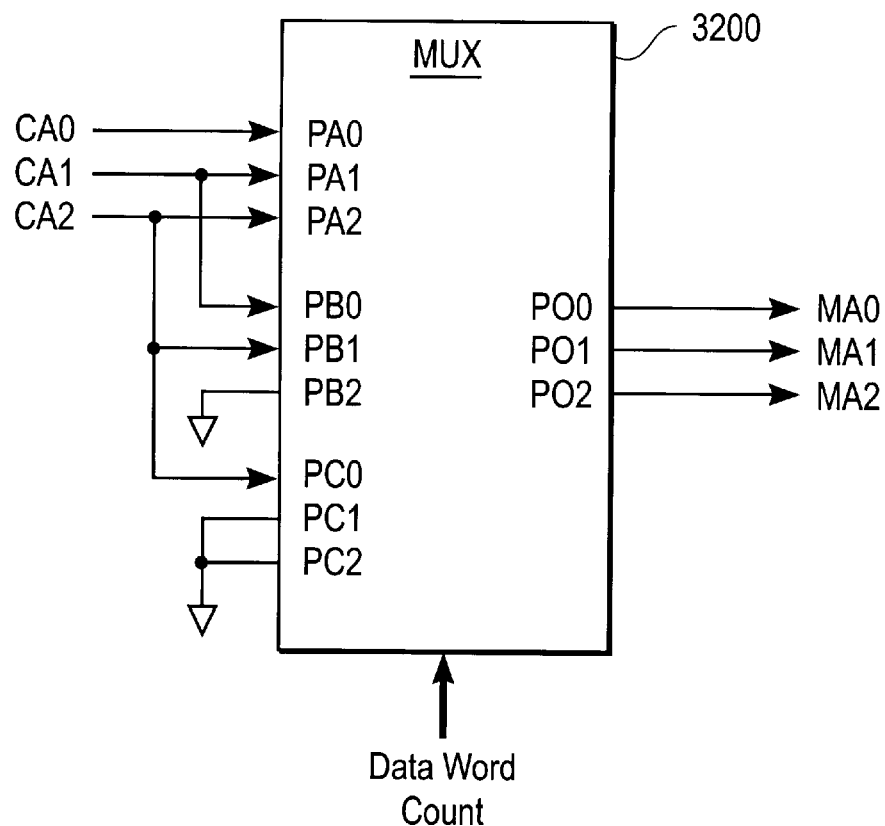
FIG. 31 is a truth table of one embodiment of the address translation logic of FIG. 29.
FIG. 32 is a multiplexer that is one embodiment of the truth table of FIG. 31 and the address translation logic of FIG. 29.

For another embodiment, address translation logic 2902 may use a block address scheme to translate the match address from priority encoder 104 to an address for associated data in memory 2204. As shown in FIG. 24, a memory address can be generated for each of the data word chains 2210 and 2212 to access AD0 and AD1 at memory addresses 0 and 1, respectively. In this example, the CAM addresses in array 2214 and output as match addresses from priority encoder 104 are mapped to the desire memory addresses for memory 2204. Thus, CAM addresses 0–3 are mapped to memory address 0, and CAM addresses 4–7 are mapped to memory address 1. Note that memory address bits MA2 and MA1 are always set to a low state, while MA0 is the same as CA2. For another example, as shown in FIG. 31, if CAM array 2214 stores four data word chains 0–3 each having two data words, then CAM addresses 0–1 are mapped to memory address 0, CAM addresses 2–3 are mapped to memory address 1, CAM addresses 4–5 are mapped to memory address 2, and CAM addresses 6–7 are mapped to memory address 3. Note that memory address bit MA2 is set to a low state, while MA1 and MA0 are set the same states as CA2 and CA1, respectively. Finally, if each data word chain has only one data word, then no translation is required and the CAM addresses can be used for the memory addresses.

FIG. 32 is a multiplexer 3200 that is one embodiment of address translation logic 2902 for performing the translation described above with respect to FIGS. 24 and 31. Multiplexer 32 has three input ports PA, PB, and PC, and an output port PO. Input port PA is the default word port that receives the CAM match addresses CA2–CA0 on PA2–PA0, respectively. Input port PB is associated with the configuration of FIG. 31 and has PB2 connected to ground and PB0–PB1 connected to CA1–CA2, respectively. Input port PC is associated with the configuration of FIGS. 24 and 29 and has PC1–PC2 connected to ground and PC0 connected to CA2. When the data word count is set to one (default word size), PA2–PA0 is connected to PO2–PO0. When the data word count is set to two, PB2–PB0 is connected to PO2–PO0. Finally, when the data word count is set to four, PC2–PC0 is connected to PO2–PO0. This scheme can be used to accommodate any number of data word chains having any number of data words and using one or more multiplexers to make the translation between the CAM match address and the memory address storing the corresponding associated data.

Figure 33:
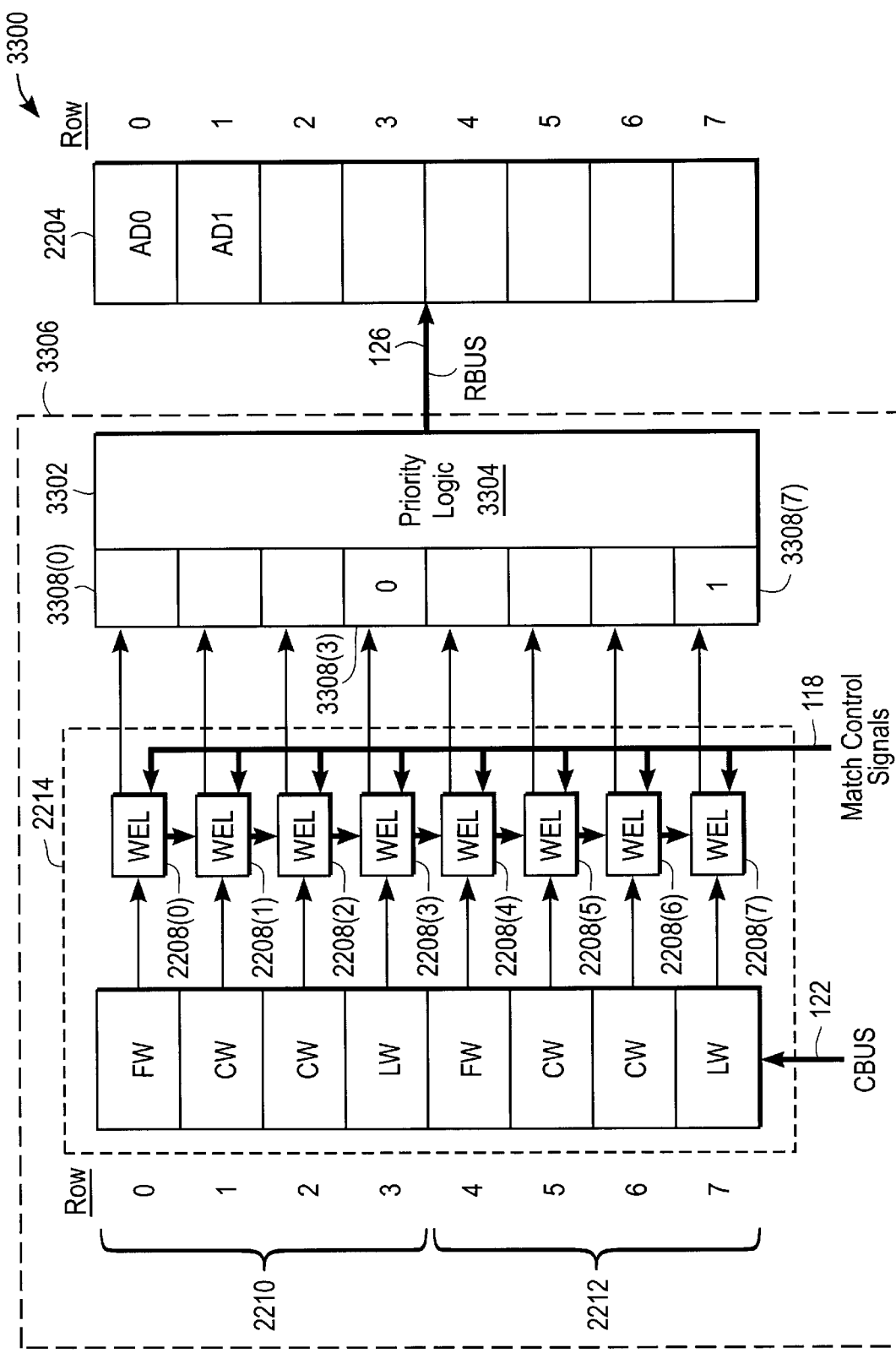
FIG. 33 is a block diagram of the CAM system of any the previous figures storing data word chains wherein the priority encoder is programmable with the addresses of memory locations in another memory that store associated data for the data word chains.

FIG. 33 shows another CAM system 3300 that is another embodiment for accessing AD0 and AD1 stored at memory addresses 0 and 4, respectively, in memory 2204. CAM system 3306 includes a programmable priority encoder 3302 that includes programmable locations 3308(0)–3308(7) and priority logic 3304. The programmable locations can be programmed with the memory addresses in memory 2204 that store the associated data for each data word chain in array 2214. For example, location 3308(3) can be programmed with a memory address of zero corresponding to data word chain 2210, and location 3308(7) can be programmed with a memory address of four corresponding to data word chain 2212. When a match is determined for the data word chains, then the programmed locations 3308 are provided to priority logic 3304 for resolution, and the highest priority programmed number output to memory 2204. The highest priority programmed number may be the highest or lowest numerical number.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) system for storing a data word chain having a sequence of one or more data words, the CAM system comprising:
    a plurality of rows of CAM cells each for storing a data word in a data word chain;
    a plurality of match lines each coupled to a corresponding row of CAM cells; and
    a plurality of width expansion logic circuits each having a match line input coupled to a match line of a corresponding row of CAM cells, a match line output, a match carry output, a match carry input, and a plurality of control inputs for receiving a plurality of control signals, wherein the match carry output of one of the width expansion logic circuits is coupled to the match carry input of another one of the width expansion logic circuits, and wherein the control signals are for determining the operation of the width expansion logic circuits and for indicating when a first data word, a continuing data word, and a last data word of the data word chain are provided for comparison with the data word of each of the rows of CAM cells, wherein the continuing data word is a data word between the first and last data word in the data word chain.

2. The CAM system of claim 1, wherein the plurality of rows of CAM cells each comprise:
    a first plurality of CAM cells for storing the data word in the data word chain; and
    a second plurality of CAM cells for storing classification information about each data word of the first plurality of CAM cells, wherein the classification information uniquely identifies each data word chain.

3. The CAM system of claim 1, wherein the plurality of rows of CAM cells each comprise:
    a first plurality of CAM cells for storing the data word in the data word chain; and a second plurality of CAM cells for storing classification information about each data word of the first plurality of CAM cells, wherein the information classification identifies the number of data words in each data word chain.

4. The CAM system of claim 1, wherein the plurality of rows of CAM cells each comprise:
   a first plurality of CAM cells for storing the data word in the data word chain; and
   a second plurality of CAM cells for storing a plurality of control bits that indicate whether the data word of the first plurality of CAM cells is the first data word, the continuing data word or the last data word in the data word chain.

5. The CAM system of claim 1, wherein the plurality of rows of CAM cells each comprise:
   a plurality of CAM cells for storing the data word in the data word chain; and
   another CAM cell for storing a control bit that indicates whether the data word of the plurality of CAM cells is the first data word in the data word chain.

6. The CAM system of claim 1, wherein the plurality of rows of CAM cells each comprise:
   a plurality of CAM cells for storing the data word in the data word chain; and
   another CAM cell for storing a control bit that indicates whether the data word of the plurality of CAM cells is the last data word in the data word chain.

7. The CAM system of claim 1, wherein the plurality of rows of CAM cells each comprise a plurality of CAM cells for storing the data word in the data word chain, and wherein the CAM system further comprises a plurality of memory elements for storing a plurality of control bits that indicate whether the data word of the first plurality of CAM cells is the first data word, the continuing data word or the last data word in the data word chain.

8. The CAM system of claim 1, wherein the plurality of rows of CAM cells each comprise a plurality of CAM cells for storing the data word in the data word chain, and wherein the CAM system further comprises a memory element coupled to the width expansion logic circuit and for storing a control bit that indicates whether the data word of the plurality of CAM cells is the first data word in the data word chain.

9. The CAM system of claim 1, wherein the plurality of rows of CAM cells each comprise a plurality of CAM cells for storing the data word in the data word chain, and wherein the CAM system further comprises a memory element coupled to the width expansion logic circuit and for storing a control bit that indicates whether the data word of the plurality of CAM cells is the last data word in the data word chain.

10. The CAM system of claim 1, further comprising an instruction decoder for determining the control signals in response to decoding a compare instruction.

11. The CAM system of claim 1, wherein each width expansion logic circuit comprises:
    a match carry generator circuit coupled to the match line input, at least one of the control inputs, and the match carry output, the match carry generator circuit for generating a match carry output signal; and
    a match result generator circuit coupled to the match line input, at least one of the control inputs, and the match line output, the match result generator circuit for generating a match output signal.

12. The CAM system of claim 11, wherein the match carry output signal is indicative of when a corresponding row of CAM cells stores a data word that matches comparand data.

13. The CAM system of claim 11, wherein the match carry output signal is indicative of when (i) a corresponding row of CAM cells stores a data word that matches first comparand data, and (ii) another row of CAM cells stores a data word that matches second comparand data.

14. The CAM system of claim 11, wherein the match output signal is indicative of when a corresponding row of CAM cells stores a data word that matches comparand data.

15. The CAM system of claim 11, wherein the match output signal is indicative of when (i) a corresponding row of CAM cells stores the last data word of a data word chain, and (ii) another row of CAM cells stores the first word of the data word chain.

16. The CAM system of claim 11, wherein the match output signal is indicative of when (i) a corresponding row of CAM cells stores the last data word of a data word chain, (ii) one or more rows of CAM cells stores one or more continuing data words of the data word chain, and (iii) another row of CAM cells stores the first word of the data word chain.

17. The CAM system of claim 11, wherein the match output signal is indicative of a mismatch between a first data word stored in a corresponding row of CAM cells and comparand data regardless of whether there is a match.

18. The CAM system of claim 11, wherein the match carry generator circuit comprises:
    a first logic circuit having a first input coupled to the match line input and a second input coupled to receive a first control signal from one of the control inputs, the first logic circuit configured to determine when a corresponding row of CAM cells stores the first data word of a data word chain; and
    a second logic circuit having a first input coupled to the match line, a second input coupled to the match carry input, and a third input coupled to receive a second control signal from another one of the control inputs, the second logic circuit configured to determine when the corresponding row of CAM cells stores a continuing data word of a data word chain and another row of CAM cells stores the first data word of the data word chain.

19. The CAM system of claim 11, wherein the match result generator circuit comprises:
    a first logic circuit having a first input coupled to the match line input and a second input coupled to receive a first control signal from one of the control inputs, the first logic circuit configured to determine when a corresponding row of CAM cells stores a data word that matches a data word chain having the same number of bits as in the corresponding row of CAM cells; and
    a second logic circuit having a first input coupled to the match line, a second input coupled to the match carry input, and a third input coupled to receive a second control signal from another one of the control inputs, the second logic circuit configured to determine when the corresponding row of CAM cells stores the last data word of a data word chain and another row of CAM cells stores the first or continuing data word of the data word chain.

20. The CAM system of claim 1, further comprising a priority encoder coupled to the match line outputs of the width expansion logic circuits.

21. The CAM system of claim 20, further comprising an address translation logic circuit coupled to the priority encoder.

22. The CAM system of claim 21, wherein the address translation circuit comprises a multiplexer.

23. The CAM system of claim 21, wherein the address translation circuit comprises an arithmetic logic unit.

24. The CAM system of claim 23, wherein the arithmetic logic unit comprises a subtractor circuit.

25. A content addressable memory (CAM) system for storing a data word chain having a sequence of one or more data words, the CAM system comprising:
- a plurality of rows of CAM cells each for storing a data word in a data word chain;
- a plurality of match lines each coupled to a corresponding row of CAM cells; and
- a plurality of width expansion logic circuits each having a match line input coupled to a match line of a corresponding row of CAM cells, a match line output, a match carry output, a match carry input, and a plurality of control inputs for receiving a plurality of control signals, wherein the match carry output of one of the width expansion logic circuits is coupled to the match carry input of another one of the width expansion logic circuits, and wherein the control signals are for determining the operation of the width expansion logic circuits and for indicating when a first data word and a last data word of the data word chain are provided for comparison with the data word of each of the rows of CAM cells.

26. A content addressable memory (CAM) system for storing a data word chain having a sequence of one or more data words, the CAM system comprising:
- a plurality of rows of CAM cells each including:
  - a first plurality of CAM cells for storing a data word in the data word chain;
  - a second plurality of CAM cells for storing a plurality of control bits that indicate whether the data word of the first plurality of CAM cells is the first data word, a continuing data word or the last data word in the data word chain, wherein the continuing data word is a data word between the first and last data word in the data word chain;
- a plurality of match lines each coupled to a corresponding row of CAM cells; and
- a plurality of width expansion logic circuits each having a match line input coupled to a match line of a corresponding row of CAM cells, a match line output, a match carry output, a match carry input, and a plurality of control inputs coupled to receive the plurality of control bits from the second plurality of CAM cells, wherein the match carry output of one of the width expansion logic circuits is coupled to the match carry input of another one of the width expansion logic circuits.

27. The CAM system of claim 26, further comprising a priority encoder coupled to the match line outputs of the width expansion logic circuits.

28. The CAM system of claim 27, further comprising an address translation logic circuit coupled to the priority encoder.

29. The CAM system of claim 28, wherein the address translation circuit comprises a multiplexer.

30. The CAM system of claim 28, wherein the address translation circuit comprises an arithmetic logic unit.

31. The CAM system of claim 30, wherein the arithmetic logic unit comprises a subtractor circuit.

32. A content addressable memory (CAM) system for storing a data word chain having a sequence of one or more data words, the CAM system comprising:
- a plurality of rows of CAM cells each for storing a data word in the data word chain;
- a plurality of memory element groups each for storing a plurality of control bits that indicate whether the data word of a corresponding row of CAM cells is the first data word, a continuing data word or the last data word in the data word chain, wherein the continuing data word is a data word between the first and last data word in the data word chain;
- a plurality of match lines each coupled to a corresponding row of CAM cells; and
- a plurality of width expansion logic circuits each having a match line input coupled to a match line of a corresponding row of CAM cells, a match line output, a match carry output, a match carry input, and a plurality of control inputs coupled to receive the plurality of control bits from a corresponding memory element group, wherein the match carry output of one of the width expansion logic circuits is coupled to the match carry input of another one of the width expansion logic circuits.

33. The CAM system of claim 32, further comprising a priority encoder coupled to the match line outputs of the width expansion logic circuits.

34. The CAM system of claim 33, further comprising an address translation logic circuit coupled to the priority encoder.

35. The CAM system of claim 34, wherein the address translation circuit comprises a multiplexer.

36. The CAM system of claim 34, wherein the address translation circuit comprises an arithmetic logic unit.

37. The CAM system of claim 36, wherein the arithmetic logic unit comprises a subtractor circuit.

38. A content addressable memory (CAM) system for storing a data word chain having a sequence of one or more data words, the CAM system comprising:
- a plurality of rows of CAM cells each for storing a data word in a data word chain; and
- means for determining when the data word of a one of the rows of CAM cells is the first data word, a continuing data word, or the last data word of the data word chain, wherein a continuing data word is a data word between the first and last data words in the data word chain.

39. The CAM system of claim 38, further comprising means for determining when all of the data words in a data word chain match all corresponding data word chains stored in the plurality of rows of CAM cells.

40. The CAM system of claim 39, further comprising priority encoding means for determining the highest priority address of the plurality of rows of CAM cells that stores all of the data words of the data word chain.

41. The CAM system of claim 40, further comprising means for translating the highest priority address into another address.

42. A content addressable memory (CAM) comprising:
- a first plurality of rows CAM cells each for storing a data word in a first data word chain,
- a second plurality of rows of CAM cells each for storing a data word in a second data word chain, wherein the number of data words in the second data word chain is different than the number of data words in the first data word chain; and
- means for distinguishing a match of comparand data with the first data word chain from a match with the second data word chain.

43. A method comprising:
generating first match results on a plurality of match lines in response to a comparison of a first data word of a data word chain with data words stored in each of a plurality of rows of CAM cells;

providing the first match results to width expansion logic circuits;

outputting a mismatch state from the width expansion logic circuits regardless of the first match results.

44. The method of claim 43, further comprising:

generating second match results on the plurality of match lines in response to a comparison of a second data word of the data word chain with data words stored in each of the plurality of rows of CAM cells;

providing the second match results to the width expansion logic circuits; and logically combining the first match results and the second match results in the width expansion logic circuits.

45. The method of claim 44, wherein the second data word is the last data word of the data word chain.

46. The method of claim 44, wherein the second data word is a continuing data word of the data word chain, wherein the continuing data word is between the first data word and a last data word of the data word chain.

47. The method of claim 44, further comprising:

outputting a mismatch state from the width expansion logic circuits regardless of the first and second match results;

generating third match results on the plurality of match lines in response to a third comparison of a third data word of the comparand data line with data words stored in each of the plurality of rows of content addressable memory (CAM) cells;

providing the third match results to the width expansion logic circuits; and logically combining the first match results, second match results, and third match results in the width expansion logic circuits to generate a match result for the data word chain.

48. A method comprising:

comparing, in response to a first instruction, a first data word of a data word chain with data words stored in each of a plurality of rows of CAM cells, wherein the data word chain comprises a sequence of one or more data words; and comparing, in response to a second instruction, a last data word of the data word chain with data words stored in each of the plurality of rows of CAM cells, wherein the first and second instructions are uniquely coded instructions.

49. The method of claim 48, further comprising comparing, in response to a third instruction, a continuing data word of the data word chain with data words stored in each of the plurality of rows of CAM cells, wherein the first, second and third instructions are uniquely coded instructions, and wherein the continuing data word is data word between the first and last data word in the data word chain.

* * * * *